US012388376B2

(12) United States Patent  
Li

(10) Patent No.: US 12,388,376 B2  
(45) Date of Patent: Aug. 12, 2025

(54) MICROMECHANICAL ARM ARRAY WITH MICRO-SPRING STRUCTURES IN MICRO-ELECTROMECHANICAL SYSTEM (MEMS) ACTUATORS

(71) Applicant: Taiwan Semiconductor Manufacturing Company, Ltd., Hsinchu (TW)

(72) Inventor: Yu-Hsun Li, Yunlin County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 51 days.

(21) Appl. No.: 18/362,937

(22) Filed: Jul. 31, 2023

(65) Prior Publication Data  
US 2025/0047218 A1 Feb. 6, 2025

(51) Int. Cl.  
*B81B 3/00* (2006.01)  
*H01H 3/60* (2006.01)  
*H02N 1/00* (2006.01)  
*H04N 23/68* (2023.01)

(52) U.S. Cl.  
CPC ........... *H02N 1/008* (2013.01); *H04N 23/687* (2023.01)

(58) Field of Classification Search  
CPC ........ H01H 3/60; H02N 1/008; H04N 23/687; B81B 3/0051; B81B 3/0035  
USPC ......................................................... 310/309  
See application file for complete search history.

(56) References Cited

U.S. PATENT DOCUMENTS

| 8,756,996 B2* | 6/2014 | Reinmuth ............. G01P 15/125 73/514.32 |
| 11,387,748 B2* | 7/2022 | Hsu ........................ H02N 1/008 |
| 11,757,378 B1* | 9/2023 | Liao ........................ B81B 3/007 310/309 |
| 2013/0076919 A1 | 3/2013 | Gutierrez et al. |
| 2014/0092493 A1 | 4/2014 | Topliss |

(Continued)

FOREIGN PATENT DOCUMENTS

| CN | 106443933 A | 2/2017 |
| TW | 202118720 A | 5/2021 |

OTHER PUBLICATIONS

Office Action of Corresponding TW Patent Application No 113128563 dated Jun. 26, 2025.

*Primary Examiner* — Burton S Mullins  
(74) *Attorney, Agent, or Firm* — KILPATRICK TOWNSEND & STOCKTON LLP

(57) ABSTRACT

MEMS actuators having micro spring structures and methods of fabricating the same are provided. An example MEMS actuator includes a first micromechanical arm array including multiple first micromechanical arms spaced from each other in a first horizontal direction and a second micromechanical arm array including multiple second micromechanical arms spaced from each other in the first horizontal direction. The first and the second micromechanical arm arrays are interposed in the first horizontal direction. The MEMS actuator further includes a metal connection structure connected to each first micromechanical arm, and a vertical micro spring structure disposed between the metal connection structure and one of the second micromechanical arms. The vertical micro spring structure includes an upper portion connected to the metal connection structure and a lower portion connected to a top end of the second micromechanical arm.

20 Claims, 32 Drawing Sheets

(56) References Cited

U.S. PATENT DOCUMENTS

| | | |
|---|---|---|
| 2020/0371376 A1 | 11/2020 | Giusti et al. |
| 2022/0162058 A1* | 5/2022 | Hsieh .................. B81C 1/00333 |
| 2023/0136105 A1* | 5/2023 | Miller ................... B81B 3/0051 |
| | | 359/872 |
| 2023/0219803 A1* | 7/2023 | Partanen ............... B81B 3/0051 |
| | | 257/415 |
| 2023/0234834 A1* | 7/2023 | Partanen ............... B81B 7/0016 |
| | | 310/40 MM |

* cited by examiner

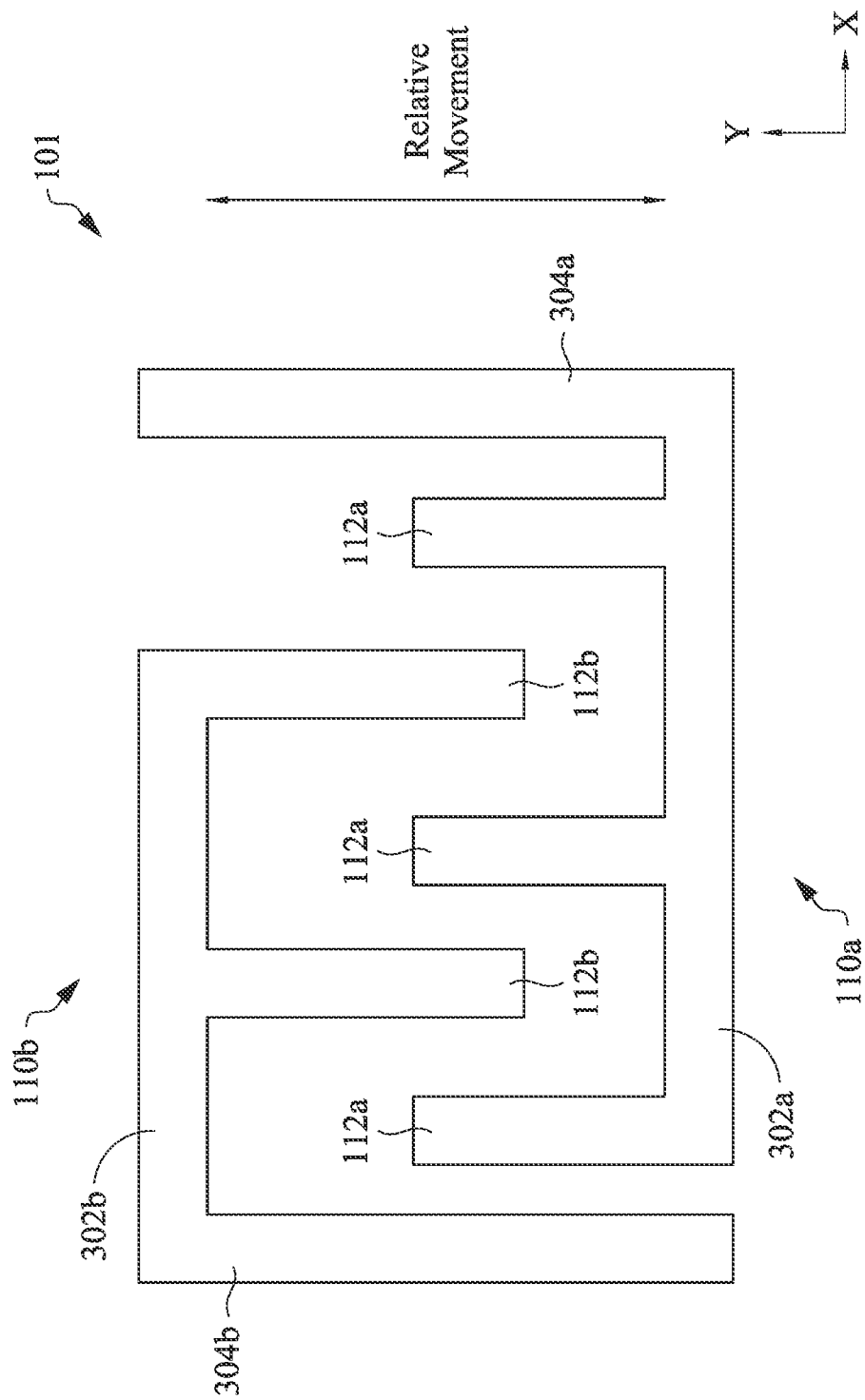

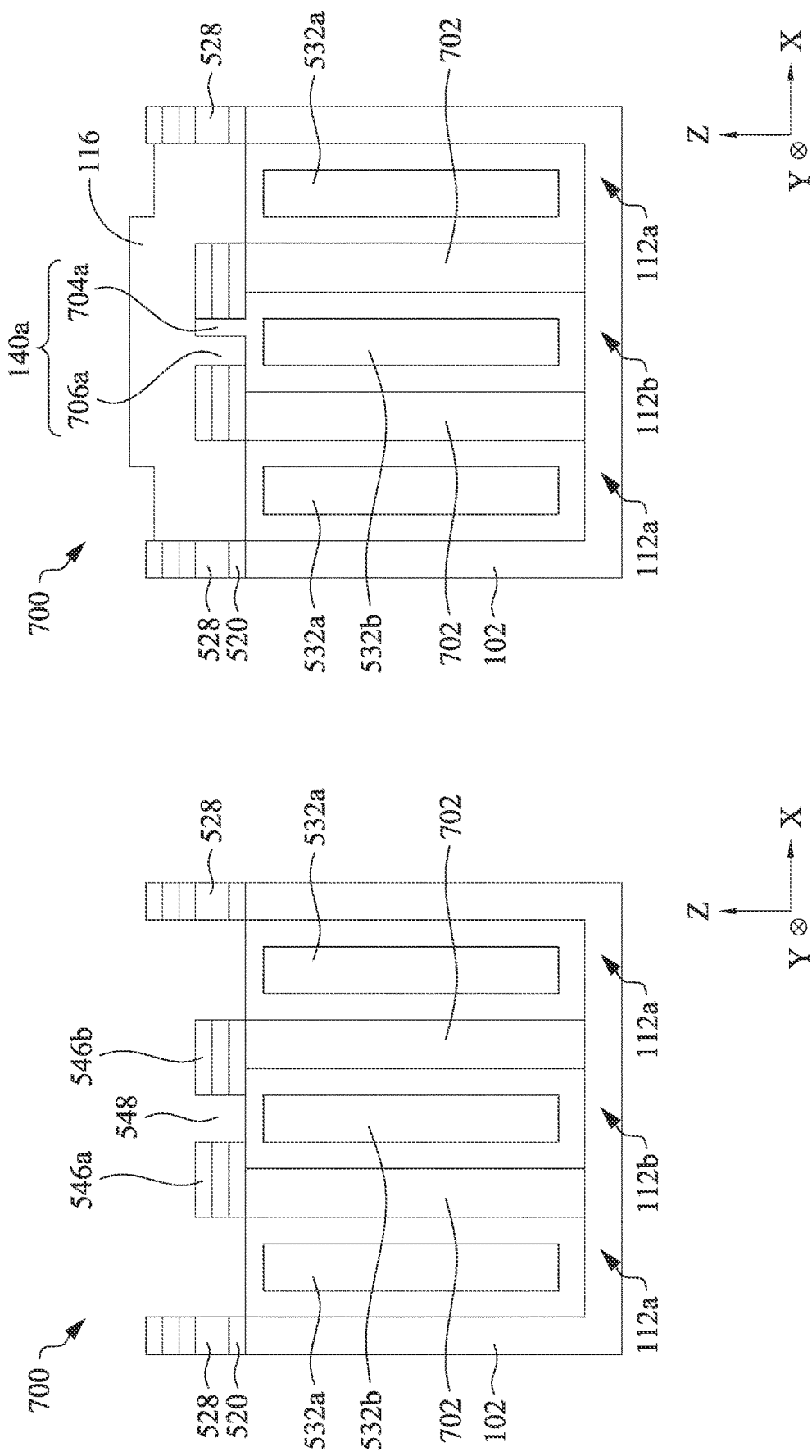

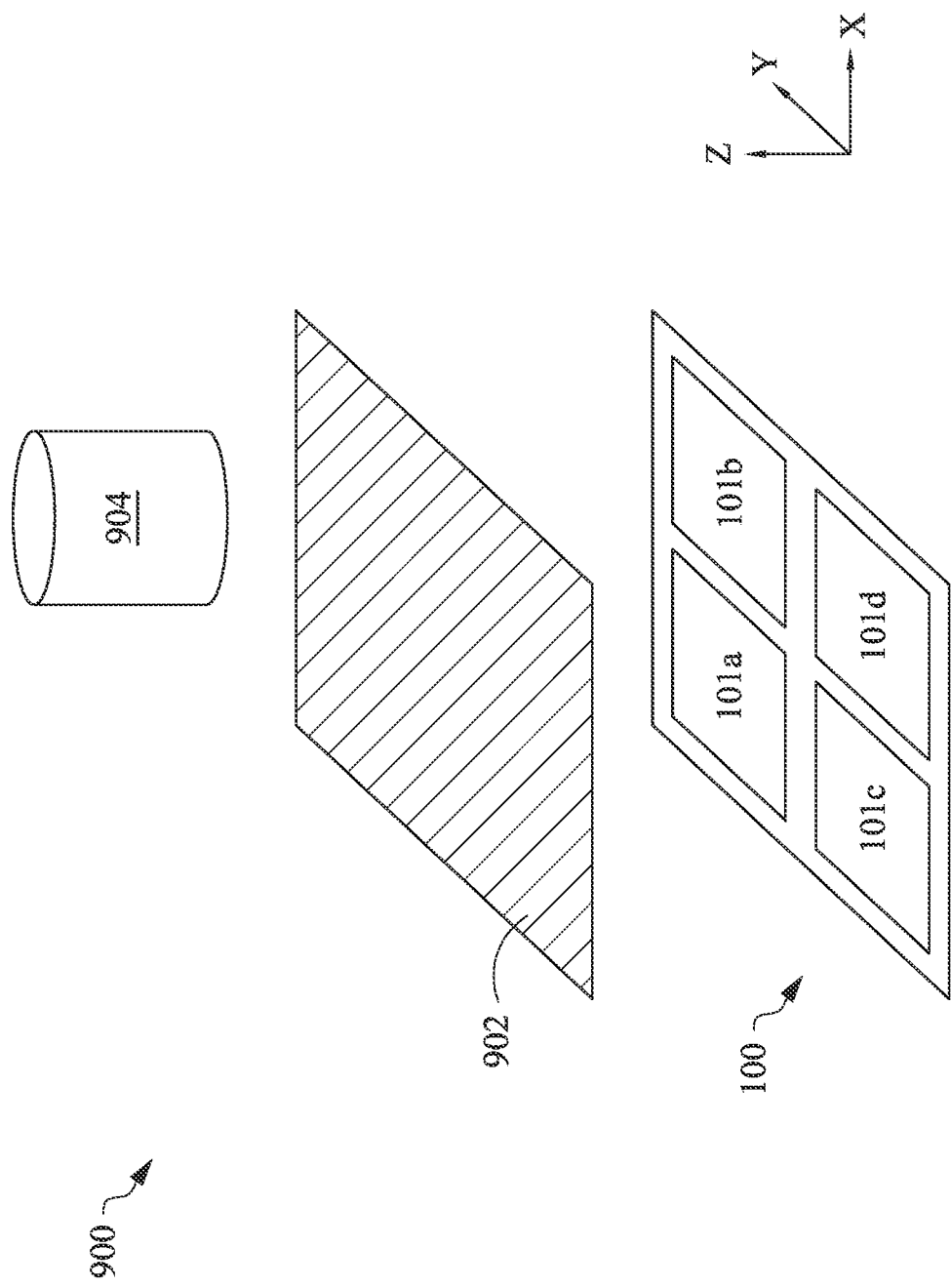

MICROMECHANICAL ARM ARRAY WITH MICRO-SPRING STRUCTURES IN MICRO-ELECTROMECHANICAL SYSTEM (MEMS) ACTUATORS

FIELD

Embodiments of the present disclosure relate generally to micro-electromechanical systems (MEMS) or nano-electromechnical systems (NEMS) devices, and more particularly to micromechanical arm array used in MEMS actuators.

BACKGROUND

Micro-electromechanical systems ("MEMS") are becoming increasingly popular, particularly as such devices are miniaturized and are integrated into integrated circuit manufacturing processes. MEMS are typically made up of components between 1 and 100 micrometers in size, and MEMS devices generally range in size from 20 micrometers to a millimeter. MEMS merge at the nanoscale into nano-electromechnical systems (NEMS) and nanotechnology.

MEMS devices include mechanical and electrical features formed by one or more semiconductor manufacturing processes. Examples of MEMS devices include micro-sensors, which convert mechanical signals into electrical signals; micro-actuators, which convert electrical signals into mechanical signals; and motion sensors, which are commonly found in automobiles (e.g., in airbag deployment systems) and smartphones. For many applications, MEMS devices are electrically connected to application-specific integrated circuits (ASICs), and to external circuitry to form complete MEMS systems. However, if a MEMS device breaks, for example, due to some impact when being used, it is difficult, if not infeasible, to repair or replace the broken MEMS device. Therefore, there is a need to fabricate reliable and impact-resistant MEMS devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a schematic diagram illustrating a cross-section view taken at an imaginary line A-A' shown in FIG. 1 in accordance with some embodiment.

FIGS. 7A-7H are schematic diagrams illustrating cross-sectional views of a MEMS system and a selected region thereof at various stages of fabrication of the MEMS system in accordance with some embodiments.

FIG. 9 is a schematic diagram illustrating a perspective view of an exemplary sensor-shift optical image stabilization (OIS) system including a MEMS system in accordance with some embodiments.

DETAILED DESCRIPTION OF THE INVENTION

Figure 1:
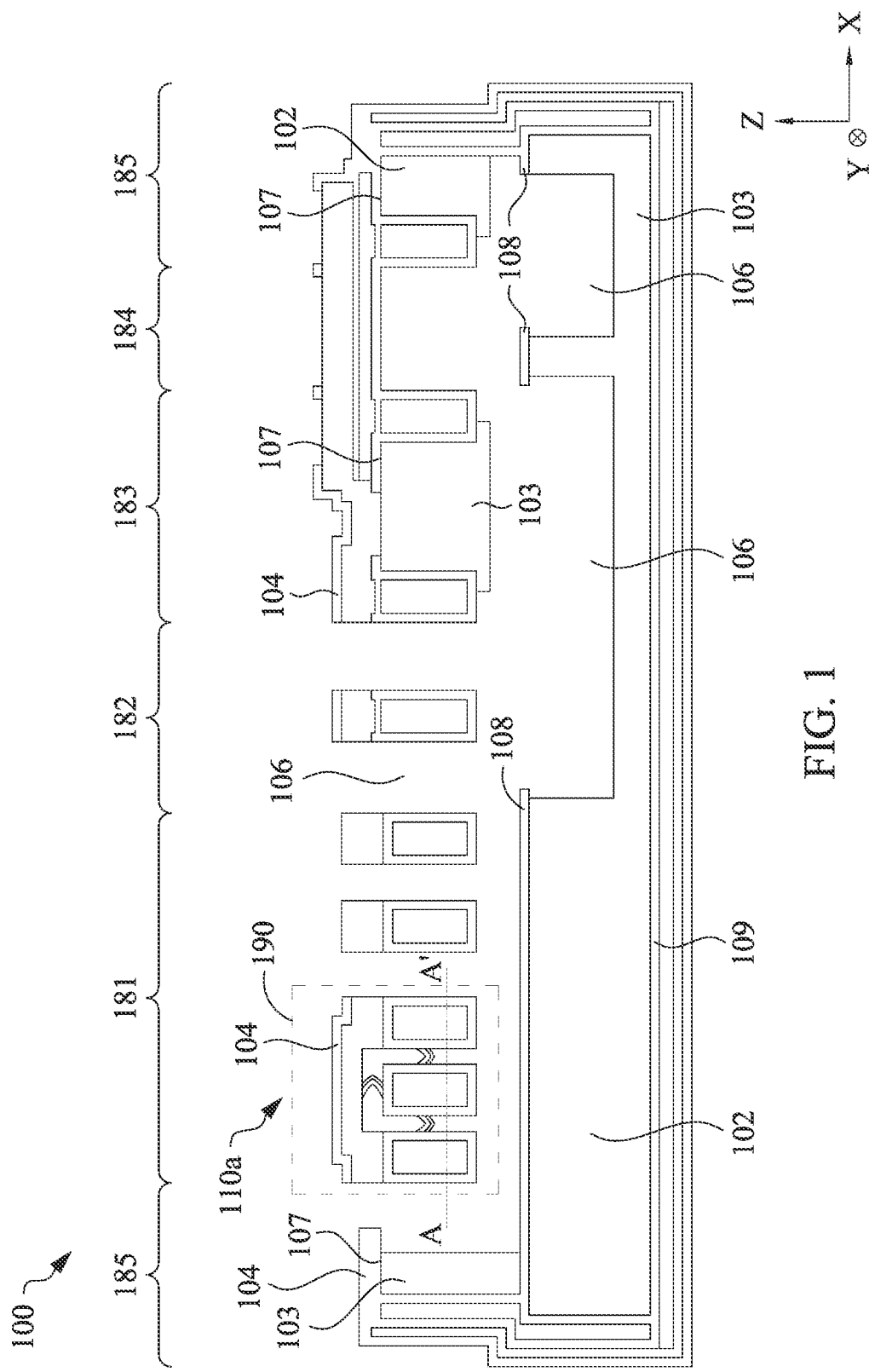
FIG. 1 is a schematic diagram illustrating a cross-sectional view of an exemplary MEMS system including micromechanical arm arrays and a micro spring structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Optical image stabilization (OIS) is a family of techniques that reduce blurring associated with the motion of a camera or other imaging devices during exposure. Image stabilization is typically used in high-end image-stabilized binoculars, still and video cameras, astronomical telescopes, and high-end smartphones. Lens-based OIS works by moving the lens to compensate for the change in the optical path. Sensor-shift OIS, on the other hand, works by moving the image sensor instead of the lens to compensate for the change in the optical path.

The advantage of moving the image sensor, instead of the lens, is that the image can be stabilized even on lenses made without stabilization. This may allow the stabilization to work with many otherwise-unstabilized lenses. It also reduces the weight and complexity of the lenses. Further, when sensor-shift OIS technology improves, it requires replacing only the camera to take advantage of the improvements, which is typically far less expensive than replacing all existing lenses if relying on lens-based image stabilization.

In some implementations, sensor-shift OIS is based on a MEMS actuator which can move in, for example, five axes (i.e., X, Y, Roll, Yaw, and Pitch). An image sensor is attached to the MEMS actuator and thus can move in five axes accordingly. In some implementations, a MEMS actuator includes at least one micromechanical arm array. Each micromechanical arm array includes multiple micromechanical arms. Each micromechanical arm is typically an elongated structure fabricated using semiconductor processes.

However, the impact on the MEMS actuator can render the micromechanical arms inside MEMS actuators broken. For instance, a smartphone that has MEMS actuators accidentally falls on the ground, and the impact could result in a fractured touchscreen and broken micromechanical arms in the MEMS actuators inside the smartphone. While it is feasible to replace the touchscreen, it is impractical, if not impossible, to replace the broken micromechanical arms, given that the critical dimensions of the broken micromechanical arms are at the microscale or even the nanoscale. As a result, the functioning of the sensor-shift OIS may be significantly compromised. Thus, the robustness and impact resistance of micromechanical arms are desirable. In addition, it is desirable to have MEMS actuators with high sensitivity and conductivity.

The present disclosure provides techniques to address the above-mentioned challenges. In accordance with some aspects of the disclosure, a novel MEMS actuator is provided. In some embodiments, the MEMS actuator includes a first micromechanical arm array and a second micromechanical arm array. The first micromechanical arm array includes multiple first micromechanical arms spaced from each other, and the second micromechanical arm array includes multiple second micromechanical arms spaced from each other. The first and second micromechanical arm arrays are interposed, such that each second micromechanical arm is located between two neighboring first micromechanical arms. The MEMS actuator further includes a metal connection structure connected to each of the first micromechanical arms. The MEMS actuator also includes at least one micro spring structure configured to resist vibration of the micromechanical arms under external or environmental forces.

According to some embodiments, the MEMS actuator may include at least one vertical micro spring structure disposed between and interconnecting the metal connection structure and one of the second micromechanical arms in a vertical direction. According to some embodiments, the MEMS actuator may include at least one horizontal micro spring structure disposed between and interconnecting sidewalls of a first micromechanical arm and a second micromechanical arm adjacent to the first micromechanical arm in a horizontal direction. According to some embodiments, the MEMS actuator may include at least one vertical micro spring structure and at least one horizontal micro spring structure.

The micro spring structures advantageously provide vibration isolation, resonance control, as well as damping and energy dissipation for the MEMS actuator. The vertical micro spring structure provides vibration resistance/isolation between the micromechanical arm and the metal connection structure. Likewise, the horizontal micro spring structure provides vibration resistance/isolation between the neighboring micromechanical arms. When external vibrations or disturbances occur, the micro spring structures may absorb and dampen the vibrations, preventing their direct transmission to the micromechanical arms. By vibrationally isolating the micromechanical arm from the rest of the MEMS system, the micro spring structures can reduce the impact of vibrations on the motion of the micromechanical arms during operation of the MEMS actuator and thus minimize unwanted oscillations. In addition, the micro spring structure can also control resonance by altering the resonant frequency of the MEMS system and damping unwanted resonance, which may help reducing the amplitude of vibrations and stabilizing the motion of the micromechanical arms.

Moreover, the vertical micro spring structure may add another layer of buffering between the metal connection structure and the second micromechanical arm, protecting the metal connection structure and the second micromechanical arm from contact/collision under external vibrational forces. Likewise, the horizontal micro spring structure may also add another layer of buffering between the neighboring micromechanical arms, protecting the neighboring micromechanical arms and from contact/collision.

Example MEMS System and MEMS Actuator Having Micro Spring Structure

Figure 2A:
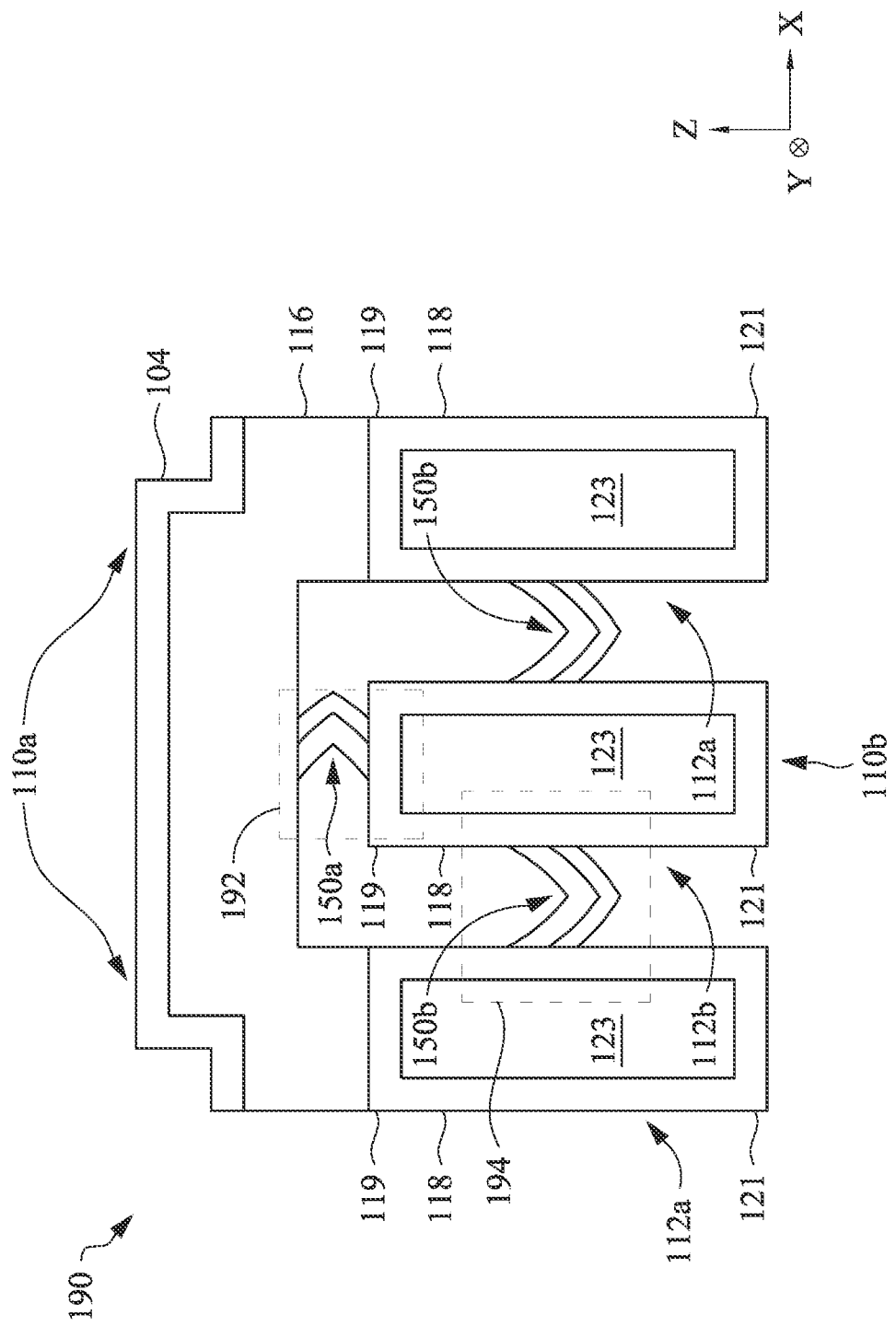
FIG. 2A is a schematic diagram illustrating a cross-sectional view of a selected region shown in FIG. 1 in accordance with some embodiments.
Figure 2B:
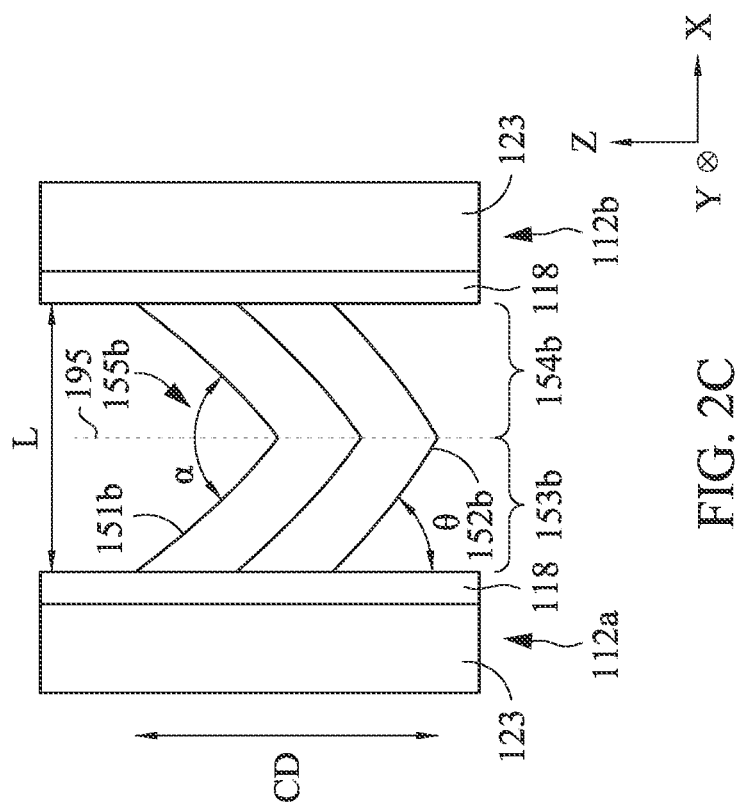
FIG. 2B is a schematic diagram illustrating a cross-sectional view of a selected region shown in FIG. 2A in accordance with some embodiments.
Figure 2C:
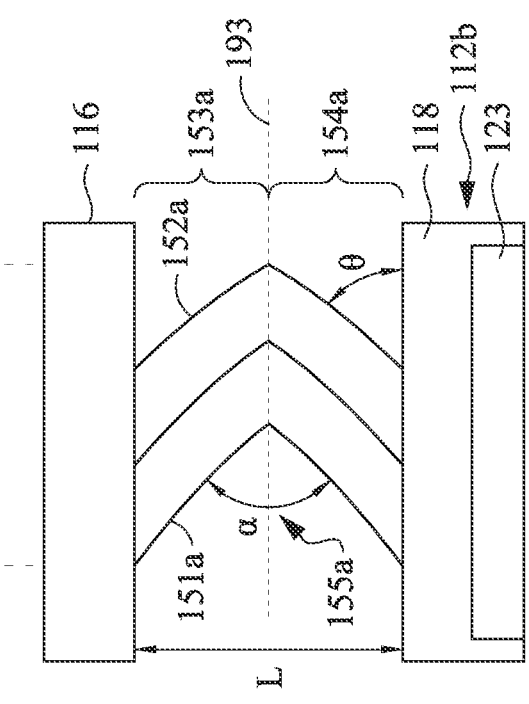
FIG. 2C is a schematic diagram illustrating a cross-sectional view of another selected region shown in FIG. 2A in accordance with some embodiments.
Figure 2D:
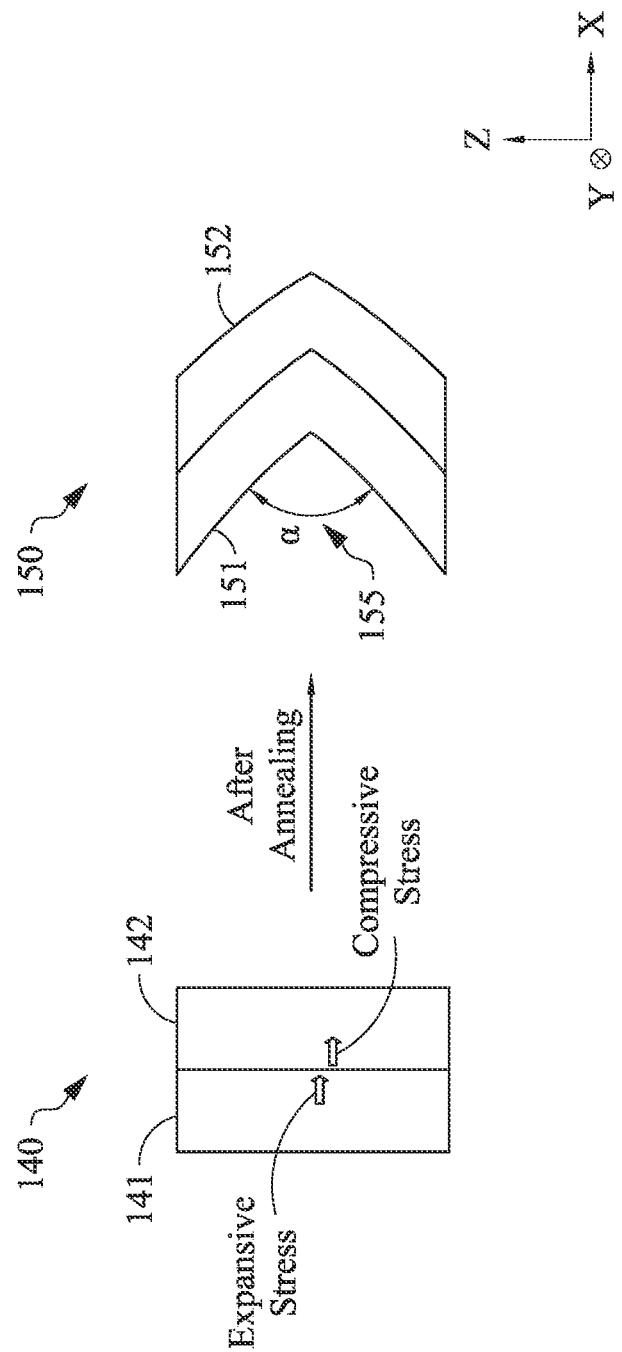
FIG. 2D is a schematic diagram illustrating an exemplary mechanism of forming a micro spring structure shown in FIG. 2A in accordance with some embodiments.

FIG. 1 is a schematic diagram illustrating a cross-sectional view of an exemplary MEMS system 100 including a MEMS actuator 101 in accordance with some embodiments. FIG. 2A is a schematic diagram illustrating a cross-sectional view of the region 190 shown in FIG. 1 in accordance with some embodiments. FIG. 2B is a schematic diagram illustrating a cross-sectional view of the region 192 shown in FIG. 2A in accordance with some embodiments. FIG. 2C is a schematic diagram illustrating a cross-sectional view of the region 194 shown in FIG. 2A in accordance with some embodiments. FIG. 2D is a schematic diagram illustrating an exemplary mechanism of the formation of the micro spring structure 150 shown in FIGS. 1 and 2A-2C in accordance with some embodiments.

In the illustrated example, the MEMS system 100 includes, among other components, a top wafer 102 (also referred to and used interchangeably with a "device wafer"), a bottom wafer 103 (also referred to and used interchangeably with a "handle wafer") bonded to the top wafer 102, a cavity 106, a passivation layer 104 disposed on the top wafer 102, and a MEMS actuator 101 including a first micromechanical arm array 110a, a second micromechanical arm array 110b, a metal connection structure 116, and at least one micro spring structure 150. Additional components may be included in the MEMS system 100.

As shown in FIG. 1, the top wafer 102 (i.e., the device wafer) extends downwardly from a top surface 107 to a bonding layer 108 (also referred to as a bonding interface), the bottom wafer 103 extends upwardly from a bottom surface 109 to the bonding layer 108, and the top wafer 102 and the bottom wafer 103 are bonded through the bonding layer 108. In some embodiments, the bonding layer 108 is a fusion bonding layer. In other words, the top wafer 102 and the bottom wafer 103 are bonded through fusion bonding, for example, through a heating and/or pressing process without the need for adhesives or intermediate layers. In some embodiments, the top wafer 102 may have a bonding dielectric layer (not shown) at a bottom surface thereof, and the bottom wafer 103 similarly has a bonding dielectric layer (not shown) at a top surface thereof, and the top wafer 102 and the bottom wafer 103 are bonded through fusion of the bonding dielectric layers to form a bonding layer 108. The top wafer 102 and the bottom wafer 103 may each include a silicon substrate.

All or a substantial portion of the cavity 106 is between the top surface 107 of the top wafer 102 and the bottom surface 109 of the bottom wafer 103. The cavity 106 defines a continuous space to allow the micromechanical arms or other movable microstructure to be disposed therein and freely move and operate. In some embodiments, a portion of the cavity 106 is across the bonding layer 108 between the top wafer 102 and the bottom wafer 103.

The MEMS system 100 may have multiple sections along the horizontal direction, including a MEMS actuator section 181 (also referred to as a "driving comb section"), a hinge section 182, an inner frame section 183, a spring section 184, and an outer frame section 185. MEMS actuator section 181 includes the MEMS actuator 101, which provides controlled movement or displacement in response to electrical signals. The hinge section 182 may include one or more hinges configured to enable pivotal movement of the MEMS actuator 101 or allow for the controlled rotation of other components within the MEMS system 100. The inner frame section 183 may provide structural support and stability to the MEMS system 100 to maintain the alignment of various components within the MEMS system 100. The hinge section 182 may include flexible spring-like structures that provide mechanical support and elasticity to maintain the desired positioning and movement of the components within the MEMS system 100 and also provide a restoring force to bring the MEMS actuator 101 back to its original position after actuation. The outer frame section 185 is configured to provide structural integrity, protecting the internal components from external and environmental forces.

In the illustrated example, the first and second micromechanical arm arrays 110a and 110b are within the MEMS actuator section 181 and substantially disposed within the top wafer 102. The first micromechanical arm array 110a includes, among other components, multiple micromechanical arms 112a and a metal connection structure 116 connecting the micromechanical arms 112a. The micromechanical arms 112a are spaced from each other in a first horizontal direction (i.e., the X-direction shown in FIG. 1). The micromechanical arms 112a are elongated and extend in parallel in a second horizontal direction (i.e., the Y-direction). In some embodiments, each micromechanical arm 112a has a free end 121 (i.e., a bottom end) and a fixed end 119 (i.e., a top end). The fixed end 119 is connected to the metal connection structure 116. In some embodiments, the micromechanical arms 112a are suspended in the cavity 106 (i.e., a gap may exist between the top surface 107 of the top wafer 102 and the fixed end 119 of each micromechanical arm 112a). As a result, the free end 121 of each micromechanical arm 112a can move freely due to the suspension of the micromechanical arm 112a in the cavity 106.

In some embodiments, each micromechanical arm 112a further includes a major body 123 and a cover layer 118 disposed on and surrounding the major body 123. The cover layer 118 encloses the major body 123 and isolates the major body 123 from the cavity 106 and the metal connection structure 116. In some embodiments, the cover layer 118 may serve as an etch stop film that prevents etchants from etching the corresponding micromechanical arm 112a during the silicon release process, which will be described below. The metal connection structure 116 extends in the X-direction and connects neighboring micromechanical arms 112a. The metal connection structure 116 is attached to the fixed end 119 (i.e., the portion of the cover layer 118 at the fixed end 119 of each micromechanical arm 112a).

In some embodiments, the micromechanical arms 112a are composed of polycrystalline silicon ("poly"), the cover layers 118 are composed of silicon dioxide ($SiO_2$), and the metal connection structure 116 is composed of metal such as aluminum copper alloy (AlCu). It should be understood that other combinations of materials can be employed in other embodiments. For example, the micromechanical arms 112a are composed of single crystal silicon or amorphous silicon. For example, the cover layers 118 are composed of silicon nitride ($Si_3N_4$), silicon carbide (SiC), undoped silicon glass (USG), fluorosilicate glass (FSG), borophosphosilicate glass (BPSG). For example, the metal connection structure 116 may be composed of titanium nitride (TiN), tantalum nitride (TaN), Al—Si—Cu alloy, copper (Cu), or other suitable materials.

Likewise, the second micromechanical arm array 110b includes, among other components, multiple micromechanical arms 112b. In some embodiments, the second micromechanical arm array 110b also includes a metal connection structure (like the metal connection structure 116 shown in FIG. 1) connecting the micromechanical arms 112b, and the metal connection structure is not shown in the cross-section shown in FIG. 1. The micromechanical arms 112b are spaced from each other in the X-direction. The micromechanical arms 112b are elongated and extend in parallel in the Y-direction. In some embodiments, each micromechanical arm 112b extends downwardly from a fixed end 119 (i.e., a top end) to a free end 121 (i.e., a bottom end). The micromechanical arms 112b may also be suspended in the cavity 106, in a similar manner as the micromechanical arms 112a. As a result, the free end 121 of each micromechanical arm 112b can move freely due to the suspension of the micromechanical arm 112b in the cavity 106. Likewise, each micromechanical arm 112b may further include a major body 123 and a cover layer 118 disposed on and surrounding the major body 123. The cover layer 118 of the micromechanical arm 112b similarly serves as an etch stop film that prevents etchants from etching the corresponding micromechanical arm 112b during the silicon release process.

It should be understood that although two micromechanical arms 112a and one micromechanical arm 112 are illustrated in FIG. 1, it is not intended to be limiting. In other embodiments, the first micromechanical arm array 110a may include another number (e.g., eight) of micromechanical arms 112a, while the second micromechanical arm array 110b may include another number (e.g., seven) of micromechanical arms 112b. One of ordinary skill in the art would recognize many variations, modifications, and alternatives.

The micromechanical arms 112a and the micromechanical arms 112b are interposed in the X-direction. In the example shown in FIG. 1, the micromechanical arm 112b is located, in the X-direction, between two neighboring micromechanical arms 112a. A gap in the Z-direction may exist between the top surface of the micromechanical arm 112b and the metal connection structure 116 connected to the micromechanical arms 112a.

As mentioned above, in some embodiments, the second micromechanical arm array 110b includes its own metal connection structure, which extends in the X-direction and connects neighboring micromechanical arms 112b. The metal connection structure is attached to the micromechanical arms 112b, with the cover layer 118 disposed therebetween. In some embodiments, the micromechanical arms 112b are composed of poly, and the cover layer 118 disposed on each micromechanical arm 112b is composed of oxide. It should be understood that other combinations of materials can be employed in other embodiments.

In some embodiments, the at least one micro spring structure 150 includes a vertical micro spring structure 150a disposed between and interconnecting the metal connection structure 116 and the second micromechanical arm 112b in the vertical direction. In some embodiments, the at least one micro spring structure 150 includes a horizontal micro spring structure 150b disposed between and interconnecting a first micromechanical arm 112a and a neighboring second micromechanical arm 112b in the horizontal direction. In some embodiments, the at least one micro spring structure 150 includes both a vertical micro spring structure 150a and a horizontal micro spring structure 150b.

As shown in FIG. 2B, the vertical micro spring structure 150a has a curved configuration and includes a first layer 151a and a second layer 152a. The first layer 151a is composed of an expansive material (i.e., an expansive layer), and the second layer 152a is composed of a compressive material (i.e., a compressive layer). The first layer 151a and the second layer 152a are bonded to each other, stacked in the horizontal direction (i.e., the X-direction), and conformable to each other in shape. The vertical micro spring structure 150a has a first portion 153a (i.e., an upper portion) and a second portion 154a (i.e., a lower portion). The upper portion 153a and the lower portion 154a are jointed at a center (i.e., along a center line 193) of the vertical micro spring structure 150a to form a corner 155a. The corner 155a is oriented and positioned to face horizontally (i.e., in a direction from the first layer 151a (i.e., the expansive layer) to the second layer 152a (i.e., the compressive layer)). The corner 155a has an angle (α) at least partially representing the degree of curvature of the vertical micro spring structure 150a. In some embodiments, the upper portion 153a and the lower portion 154a are substantially symmetrical about the center line 193. The upper portion 153a is connected to the metal connection structure 116, and the lower portion 154a is connected to the cover layer 118 of the second micromechanical arm 112b. During operation, the vertical micro spring structure 150a may undergo elastic deformation and stretch or compress along the vertical direction.

As mentioned above, the vertical micro spring structure 150a includes an expansive layer and a compressive layer bonded and stacked together, and thus is composed of composite materials having different or opposite tensile properties. In some embodiments, vertical micro spring structure 150a may include more than two layers having different tensile properties (i.e., multiple expansive layers and/or multiple compressive layers). In some embodiments, the first layer 151a (i.e., the expansive layer) has a first coefficient of thermal expansion (CTE), and the second layer 152a (i.e., the compressive layer) has a second CTE, wherein the first CTE is substantially higher than the second CTE. In some embodiments, the first CTE is 10 to 50 parts per million per degree Celsius (ppm/° C.) or micrometers per meter per degree Celsius (μm/m/° C.). In some embodiments, the second CTE is about 0.1 to 1.0 ppm/° C.

In some embodiments, the first layer 151a is composed of a metal, a metal alloy, or a metal compound. Examples of the materials included in the first layer include but are not limited to Aluminum (Al), Copper (Cu), Tungsten (W), Nickel (Ni), AlCu alloy, etc. In some embodiments, the second layer 152a is composed of silicon, silicon oxide, borosilicate glass, FeNi alloy, etc. In some embodiments, the first layer 151a is composed of AlCu alloy, and the second layer 152a is composed of silicon oxide.

In some embodiments, the upper portion 153a and the metal connection structure 116 form an angle (θ) therebetween, and the lower portion 154a and the top surface of the second micromechanical arm 112b similarly form an angle (θ) therebetween. In some embodiments, the angle (θ) is at least 15 degrees, at least 30 degrees, at least 45 degrees, at least 60 degrees, or at least 75 degrees. In some embodiments, the angle (α) of the corner 155a is at least 15 degrees, at least 30 degrees, at least 60 degrees, at least 90 degrees, at least 120 degrees, at least 150 degrees, or at least 170 degrees.

In some embodiments, the vertical micro spring structure 150a has a length (L) (i.e., a vertical dimension in the Z-direction) of at least 1.6 μm. The length (L) is approximate the distance between the metal connection structure 116 and the top surface of the second micromechanical arm 112b. In some embodiments, the vertical micro spring structure 150a has a critical dimension (CD) (i.e., a horizontal dimension in the X-direction) of at least 1 μm. In some embodiments, the first layer 151a has a thickness of at least 100 nm, at least 200 nm, or at least 500 nm. Likewise, the second layer 152a may have a similar thickness compared with the first layer 151a, and the thickness of the second layer 152a may be at least 100 nm, at least 200 nm, or at least 500 nm.

As shown in FIG. 2C, the horizontal micro spring structure 150b also has a curved configuration in a similar manner as the vertical micro spring structure 150a. In some embodiments, the horizontal micro spring structure 150b includes a first layer 151b and a second layer 152b. The first layer 151b is composed of an expansive material (i.e., an expansive layer), and the second layer 152b is composed of a compressive material (i.e., a compressive layer). The first layer 151b and the second layer 152b are bonded to each other, stacked in the vertical direction (i.e., the Z-direction), and conformable to each other in shape. The horizontal micro spring structure 150b has a first portion 153b (i.e., a left portion shown in FIG. 2C) and a second portion 154b (i.e., a right portion shown in FIG. 2C). The first portion 153b and the second portion 154b are jointed at a center (i.e., along a center line 195) of the horizontal micro spring structure 150b to form a corner 155b. The corner 155b of the horizontal micro spring structure 150b may be oriented and positioned to face vertically (i.e., in a direction from the first layer 151b (i.e., the expansive layer) to the second layer 152b (i.e., the compressive layer)). The corner 155b similarly has an angle (α) at least partially representing the degree of curvature of the horizontal micro spring structure 150b. The first portion 153b and the second portion 154b may be substantially symmetrical about the center line 195. The first portion 153b is connected to the cover layer 118 on the sidewall of a first micromechanical arms 112a, and the second portion 154b is connected to the cover layer 118 on the sidewall of a second micromechanical arm 112b adjacent to the first micromechanical arms 112a. During operation, the horizontal micro spring structure 150b may undergo elastic deformation and stretch or compress along the horizontal direction to resist vibration of the first and second micromechanical arms 112a and 112b.

Similar to the vertical micro spring structure 150a, the horizontal micro spring structure 150b is also composed of composite materials having different or opposite tensile properties. In some embodiments, horizontal micro spring structure 150b may include more than two layers having different tensile properties (i.e., multiple expansive layers and/or multiple compressive layers). In some embodiments, the first layer 151b (i.e., the expansive layer) has a first CTE, and the second layer 152b (i.e., the compressive layer) has a second CTE, wherein the first CTE is substantially higher than the second CTE. In some embodiments, the first CTE is 10 to 50 ppm/° C. In some embodiments, the second CTE is about 0.1 to 1.0 ppm/° C.

In some embodiments, the first layer 151b is composed of a metal, a metal alloy, or a metal compound. Examples of the materials included in the first layer include but are not limited to Aluminum (Al), Copper (Cu), Tungsten (W), Nickel (Ni), AlCu alloy, etc. In some embodiments, the second layer 152b is composed of silicon, silicon oxide, borosilicate glass, FeNi alloy, etc. In some embodiments, the first layer 151b is composed of AlCu alloy, and the second layer 152b is composed of silicon oxide. In some embodiments, the vertical micro spring structure 150a and the horizontal micro spring structure 150b are composed of the same materials.

In some embodiments, the first portion 153b and the first micromechanical arm 112a form an angle (θ) therebetween, and the second portion 154b and the second micromechanical arm 112b also form an angle (θ) therebetween. In some embodiments, the angle (θ) is at least 15 degrees, at least 30 degrees, at least 45 degrees, at least 60 degrees, or at least 75 degrees. In some embodiments, the angle (α) of the corner 155b is at least 15 degrees, at least degrees, at least 60 degrees, at least 90 degrees, at least 120 degrees, at least 150 degrees, or at least 170 degrees.

Similar to the vertical micro spring structure 150a, the horizontal micro spring structure 150b has a length (L) (i.e., a horizontal dimension in the X-direction) of at least 1.6 μm. The length (L) is approximate the distance between the neighboring first and second micromechanical arms 112a and 112b. In some embodiments, the horizontal micro spring structure 150b has critical dimension (CD) (i.e., a vertical dimension in the Z-direction) of at least 1 μm. In some embodiments, the first layer 151b has a thickness of at least 100 nm, at least 200 nm, or at least 500 nm. Likewise, the second layer 152b may have a similar thickness compared with the first layer 151b, and the thickness of the second layer 152b may be at least 100 nm, at least 200 nm, or at least 500 nm. In some embodiments, the vertical and horizontal micro spring structures within the MEMS actuator 101 are substantially the same in dimension.

In some embodiments, the MEMS actuator 101 includes multiple vertical micro spring structures 150a and multiple horizontal micro spring structures 150b. Each one of the vertical micro spring structures 150a may connect a second micromechanical arm 112b and the metal connection structure 116, and each one of the horizontal micro spring structures 150b may connect a first micromechanical arm 112a and a second micromechanical arm 112b that are neighboring to each other. In some embodiments, more than one (e.g., in a row or an array) vertical micro spring structures 150a may be used to connect each one of the second micromechanical arms 112b and the metal connection structure 116, and more than one (e.g., in a column or an array) horizontal micro spring structures 150b may be used to connect the neighboring micromechanical arms 112a and 112b.

The micro spring structure 150 according to the present disclosure advantageously provides vibration isolation, resonance control, as well as damping and energy dissipation. The vertical micro spring structure 150a provides vibration resistance/isolation between the micromechanical arm 112b and the metal connection structure 116. Likewise, the horizontal micro spring structure 150b provides vibration resistance/isolation between the neighboring micromechanical arms 112a and 112b. When external vibrations or disturbances occur, the micro spring structures 150a and 150b may absorb and dampen the vibrations, preventing their direct transmission to the micromechanical arms 112a and 112b. By vibrationally isolating the micromechanical arm from the rest of the MEMS system 100, the micro spring structures 150 can reduce the impact of vibrations on the motion of the micromechanical arms 112a and 112b during operation of the MEMS actuator 101 and thus minimize unwanted oscillations. In addition, the micro spring structure 150 can also control resonance by altering the resonant frequency of the MEMS system 100 and damping unwanted resonance, which helps reducing the amplitude of vibrations and stabilizing the motion of the micromechanical arms 112a and 112b. Moreover, the vertical micro spring structure 150a may add another layer of buffering between the metal connection structure 116 and the second micromechanical arm 112b, protecting the metal connection structure 116 and the second micromechanical arm 112b from contact/collision under external vibrational forces. Likewise, the horizontal micro spring structure 150b may also add another layer of buffering between the neighboring micromechanical arms 112a and 112b, protecting the neighboring micromechanical arms 112a and 112b from contact/collision.

As shown in FIG. 2D, a mechanism for the formation of an example micro spring structure 150 from a multi-layer composite structure 140 is illustrated. In the illustrated example, a multi-layer composite structure 140 has a bilayer structure, including an expansive layer 141 and a compressive layer 142. The expansive layer 141 and the compressive layer 142 are extending in the vertical direction, bonded together, and stacked in the horizontal direction (i.e., the X-direction). The expansive layer 141 and a compressive layer 142 have substantially different (or opposite) tensile properties. The expansive layer 141 may have a high CTE, and the compressive layer 142 may have a substantially lower CTE. While not wishing to be bound to any particular theory, it is believed that when an annealing process is performed to heat the multi-layer composite structure 140 at an elevated temperature (e.g., 800° C.), a middle portion of the expansive layer 141 may undergo substantial expansion under the expansive stress in the X-direction toward the compressive layer 142, and a middle portion of the compressive layer 142 may undergo compression under the compressive stress in the same direction toward the compressive layer 142 itself. Because the expansion direction of the middle portion of the expansive layer 141 and the compression direction of the middle portion of the compressive layer 142 are the same (as indicated by the two arrows of FIG. 2D), the multi-layer composite structure 140 may bend toward horizontally in a direction from the expansive layer 141 to a compressive layer 142 to form the micro spring structure 150 having a curved and bended configuration with a corner 155 in the middle of the micro spring structure 150. The degree of curvature (i.e., the angle (α) of the corner 155) may depend on the CTE and materials of the expansive layer 141 and the compressive layer 142, the thickness of the expansive layer 141 and the compressive layer 142, as well as the annealing conditions. It should be understood that the mechanism and examples of FIG. 2D are for illustrative purposes only and are not intended to be limiting. Other mechanisms are also possible in alternative embodiments to explain the formation of the micro spring structure 150.

FIG. 3 is a diagram illustrating a cross-section taken at A-A' shown in FIG. 1 in accordance with some embodiment. It should be understood that FIG. 3 is not drawn to scale. In the example shown in FIG. 3, the MEMS actuator 101 includes the first micromechanical arm array 110a and the second micromechanical arm array 110b. The first micromechanical arm array 110a includes the micromechanical arms 112a extending in the Y-direction, a spine beam 302a extending in the X-direction, and a main beam 304a extending in the Y-direction. Likewise, the second micromechanical arm array 110b includes the micromechanical arms 112b extending in the Y-direction, a spine beam 302b, and a main beam 304b extending in the Y-direction.

Each micromechanical arm 112a has a free end and a fixed end, which is attached to the spine beam 302a. The spine beam 302a connects the multiple micromechanical arms 112a together. Similarly, each micromechanical arm 112b has a free end and a fixed end, which is attached to the spine beam 302b. The spine beam 302b connects the multiple micromechanical arms 112b together.

As mentioned above, the micromechanical arms 112a and the micromechanical arms 112b are interposed in the X-direction. When a voltage or electrical potential tension is applied between the neighboring micromechanical arms 112a and 112b, the first micromechanical arm array 110a and the second micromechanical arm array 110b are attracted to each other due to an electrostatic force. In one example, the electrostatic force is proportional to the square of the applied voltage. On the other hand, a restoring force that separates the first micromechanical arm array 110a and the second micromechanical arm array 110b may be used to balance the electrostatic force. In one implementation, the restoring force is provided by a spring structure. As a result, a relative movement (shown by the arrow in FIG. 3) in the Y-direction between the first micromechanical arm array 110a and the second micromechanical arm array 110b occurs. One of ordinary skill in the art would appreciate that movement in more directions can be achieved by combining multiple MEMS actuators that are capable of moving in different directions.

In one example, the main beam 304a is fixed with respect to the main body of the MEMS actuator 101, and the main beam 304b moves relative to the main body of the MEMS actuator. In another example, the main beam 304b is fixed with respect to the main body of the MEMS actuator 101, and the main beam 304a moves relative to the main body of the MEMS actuator. Either way, electrical signals are converted into mechanical signals, and the movement of the MEMS actuator 101 is controlled by the electrical signals.

It should be understood that the structures shown in FIG. 3 is simplified to illustrate the principle of operation of the example MEMS actuator 101. The MEMS actuator 101 can include other components as needed. One of ordinary skill in the art would recognize many variations, modifications, and alternatives.

Example Fabrication Process Flow

Figure 4:
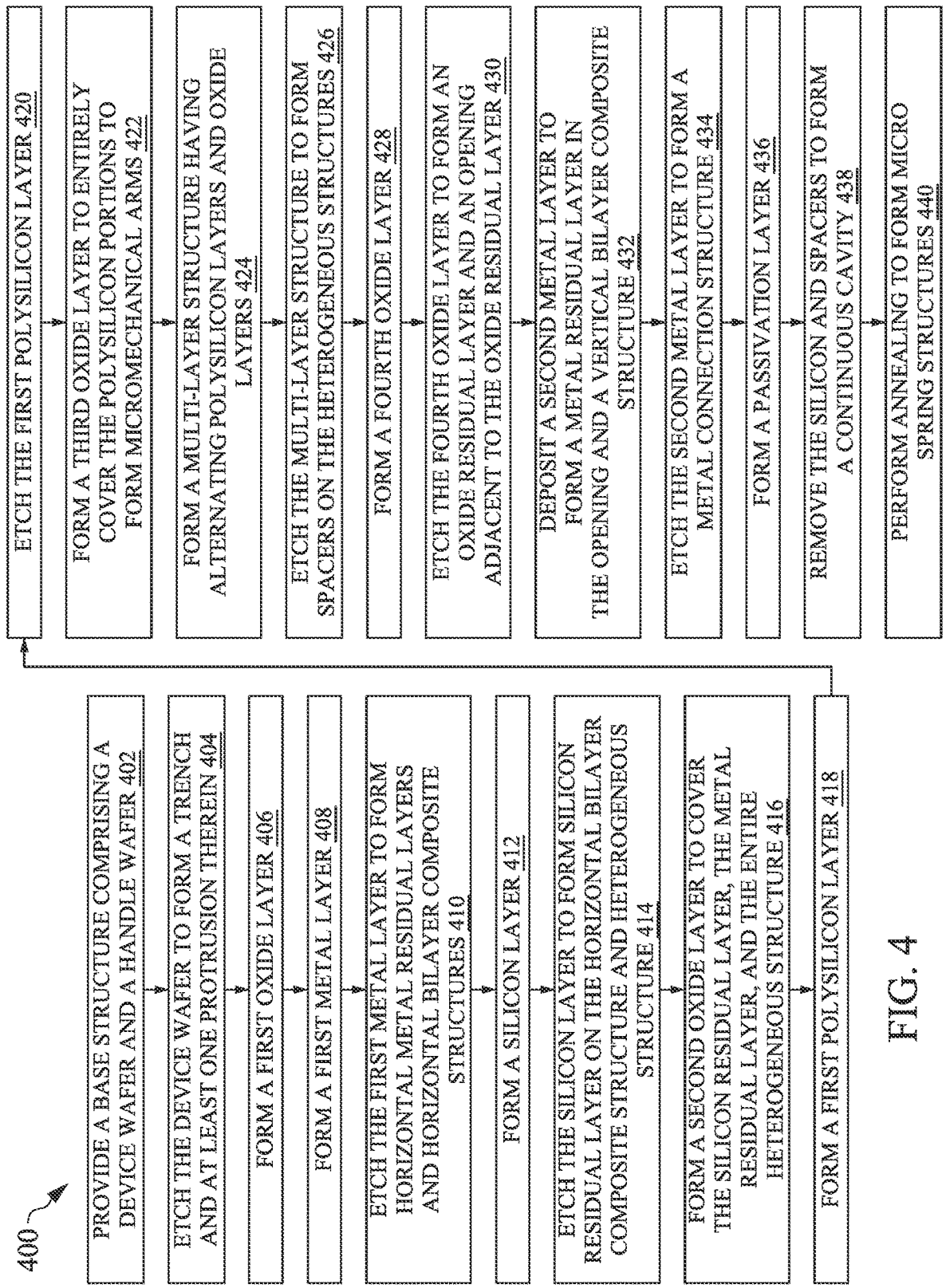
FIG. 4 is a flow diagram illustrating an exemplary method of forming a MEMS system in accordance with some embodiment.
Figure 5A:
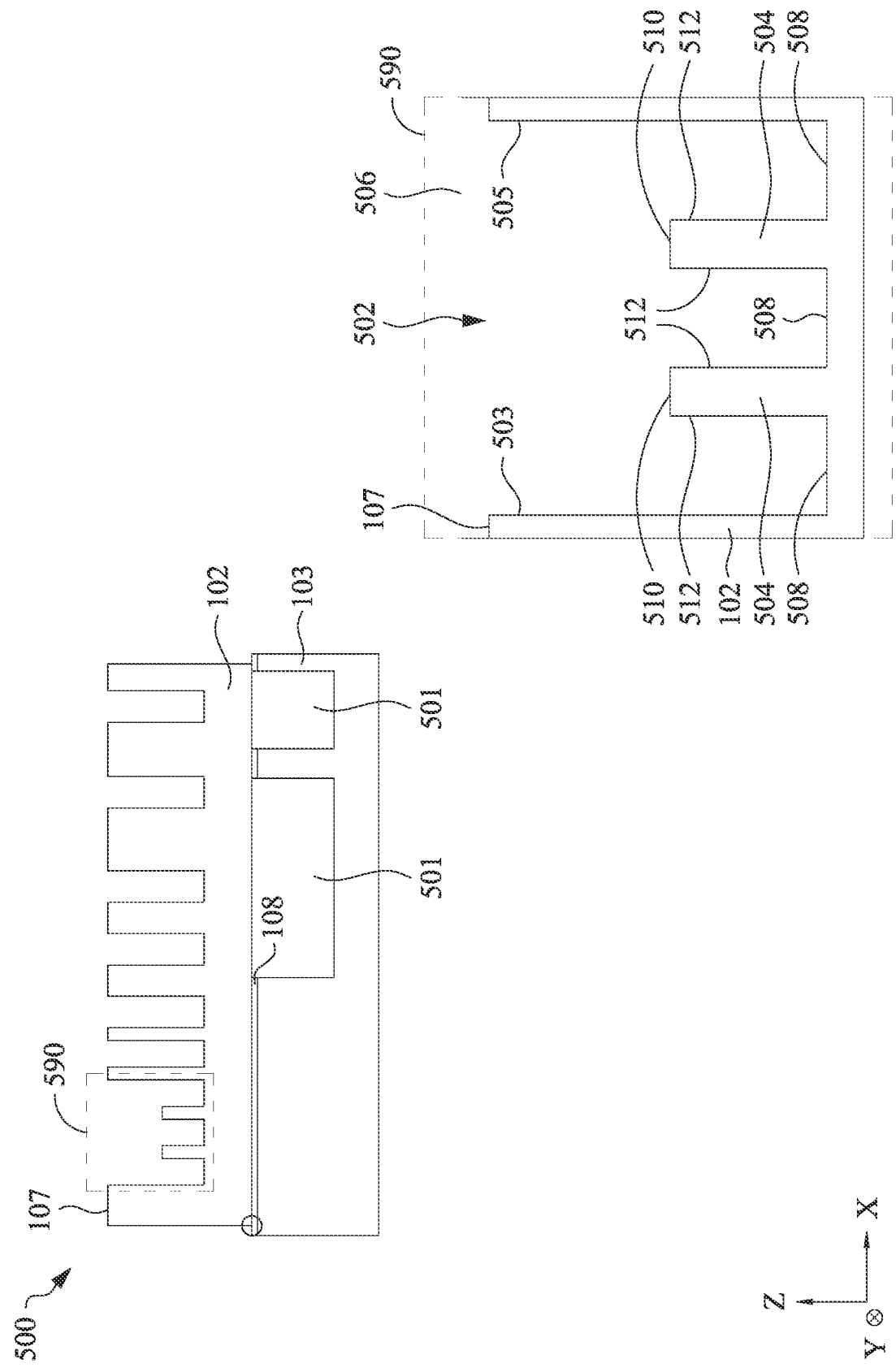
FIGS. 5A-5S are schematic diagrams illustrating cross-sectional views of a MEMS system and a selected region thereof at various stages of fabrication of the MEMS system in accordance with some embodiments.

FIG. 4 is a flowchart diagram illustrating an example method for fabricating a MEMS system 500 in accordance with some embodiments. In the example shown in FIG. 4, the method 400 includes operations 402, 404, 406, 408, 410, 412, 414, 416, 418, 420, 422, 424, 426, 428, 430, 432, 434, 436, 438, and 440. Additional operations may be performed. Also, it should be understood that the sequence of the various operations discussed above with reference to FIG. 4 is provided for illustrative purposes, and as such, other embodiments may utilize different sequences. These various sequences of operations are to be included within the scope of embodiments. FIGS. 5A-5S are schematic diagrams illustrating cross-sectional views of the MEMS system 500 and a region 590 thereof at various stages of fabrication of the MEMS system 500 in accordance with some embodiments.

At operation 402, a base structure for forming a MEMS system is provided. In the example of FIG. 5A, the base structure 500 (i.e., the base structure for the to-be-generated MEMS system 500) includes a top wafer 102 (i.e., device wafer) and a bottom wafer 103 (i.e., handle wafer) bonded at a bonding layer 108. The top wafer has a top surface 107. The bottom wafer 103 may further include one or more cavities 501 disposed therein. The cavities 501 may be isolated from each other.

At 404, the top wafer is etched to form a trench and one or more protrusions disposed therein. The trench and the protrusions will be used for forming the MEMS actuator and micro spring structures in subsequent operations. The trench may be formed by performing a patterning and etching process to remove a desired portion of the top wafer. The protrusions may be formed by performing a selective etching process. In the example of FIG. 5A, a trench 502 is formed in the top wafer 102. The trench 502 extends upwardly from a bottom surface 508 to a top open end 506 and is defined by a first sidewall 503 and a second sidewall 505. At least one protrusion 504 is formed within the trench 502. Each protrusion 504 extends vertically from the bottom surface 508 to a top surface 510 and further includes a sidewall 512. The protrusions 504 may has a height less than the depth of the trench 502, such that the top surface 510 of each protrusion 504 is between the bottom surface 508 and the top open end 506 of the trench 502. The protrusion 504 provides a support for the to-be-formed horizontal micro spring structure, and therefore the height of the protrusion 504 may determine the relative position of the to-be-formed horizontal micro spring structure in the vertical direction.

At 406, a first oxide layer is formed. The first oxide layer (i.e., silicon oxide layer) may be formed by performing a thermal oxidation process. In some embodiments, the base structure is placed in a thermal tube (also referred as a high-temperature furnace or oxidation furnace), and the thermal tube is purged with inert gas, such as nitrogen ($N_2$), to create an oxygen-free atmosphere. The thermal tube is then heated to the desired temperature (e.g., from 800 to 1600° C.). Once the desired temperature is reached, oxygen or an oxygen-containing gas, such as dry air or pure oxygen, is introduced into the tube. The oxygen reacts with the silicon surface, leading to the formation of a thermal silicon oxide layer through dry oxidation. The reaction proceeds until the desired thickness of the thermal silicon oxide layer is achieved.

Figure 5B:
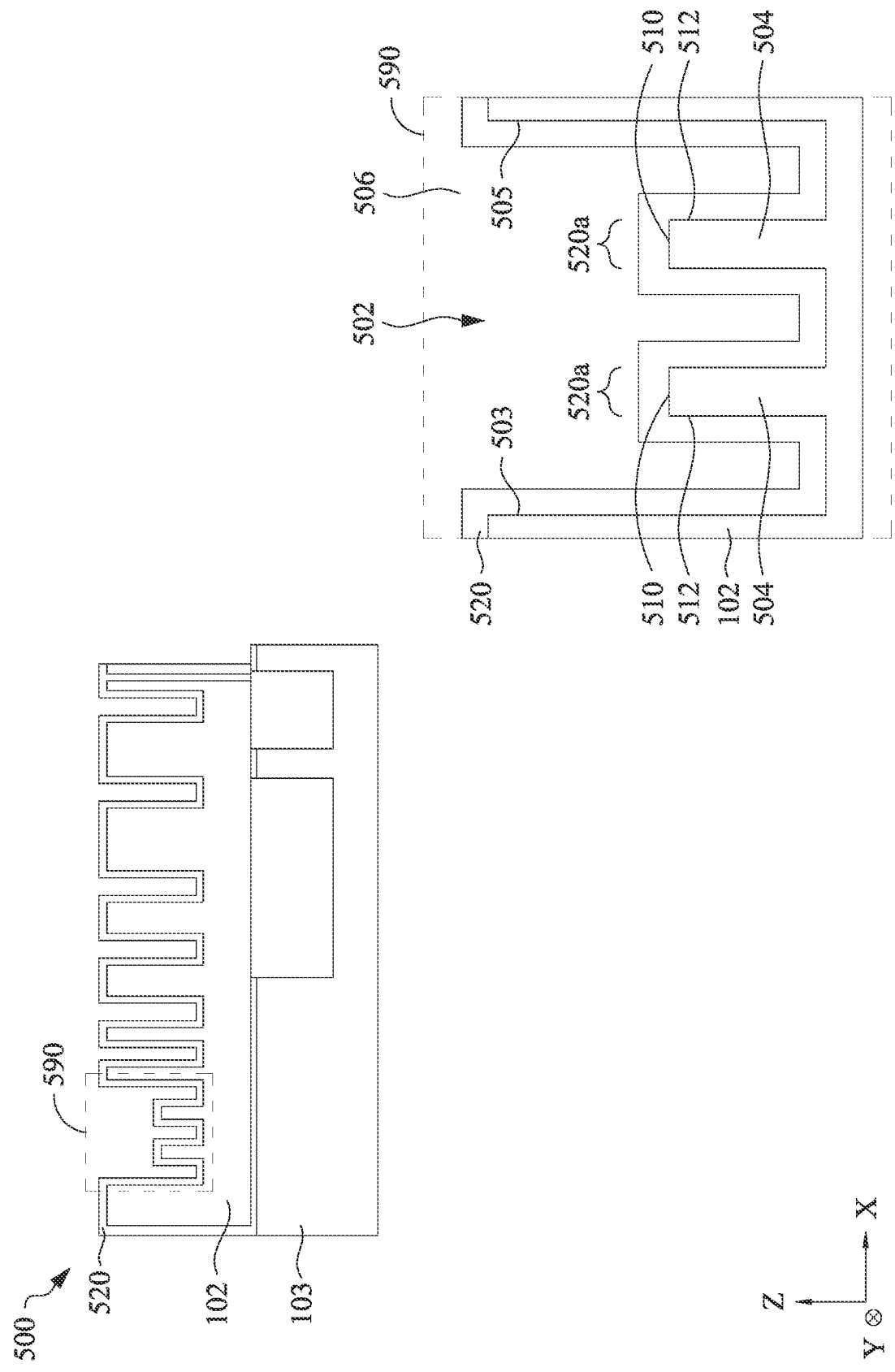

In the example of FIG. 5B, a first oxide layer 520 is formed on the top surface of the top wafer 102. The first oxide layer 520 is also deposited on and covers the bottom surface 508 and sidewalls of the trench 502 as well as the top surface 510 and sidewalls 512 of each protrusion 504. A portion of the first oxide layer 520 on the top surface 510 of the protrusion 504 is denoted as an oxide layer 520a, which will serve as the compressive layer of the to-be-formed micro spring structure in subsequent operations. The first oxide layer 520 may have a compressive property have a relatively low CTE in a range from 0.1 to 1.0 ppm/° C.

At 408, a first metal layer is formed. The first metal layer may be formed by a suitable method such as electroplating, physical vapor deposition (PVD), or sputtering deposition. In some embodiments, the first metal layer is composed of AlCu alloy. For example, the first metal layer containing AlCu may be formed by bombarding a first garget substrate of Al and a second target substrate of Cu with high-energy ions, and the ejected and sputtered Al and Cu atoms from their respective target substrate are co-deposited on the base structure to form the metal layer containing Al and Cu. An annealing or other post-sputtering treatment process may be performed subsequent to the sputtering deposition. Similarly, an electroplating process may be performed to form a metal layer of Al and Cu on the base structure by placing the base structure in an electroplating bath containing Al ions and Cu ions, applying an electric current to initiate the reduction of the Al ions and Cu ions and co-depositing Al and Cu on the base structure. In some embodiments, a planarization process (e.g., a chemical-mechanical polishing (CMP) process) is performed on the first metal layer.

Figure 5C:
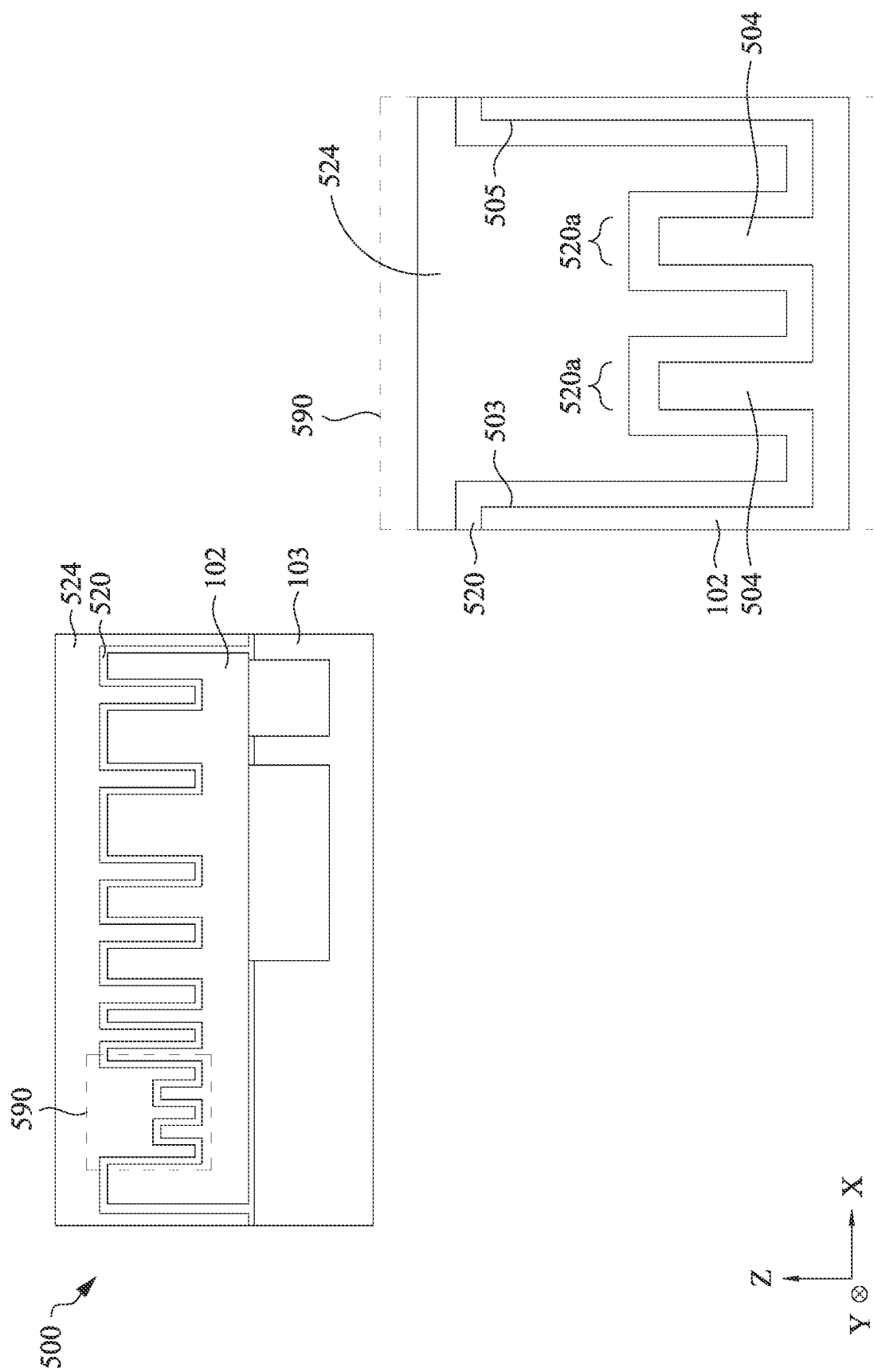

In the example of FIGS. 5B-5C, the first metal layer 524 is formed and deposited on the first oxide layer 520. The first metal layer 524 fills the trench 502 and the space between the sidewalls 503/505 and the protrusions 504 as well as the space between two neighboring protrusions 504.

At 410, the first metal layer is etched to form horizontal bilayer composite structures respectively on the protrusions in the trench. In some embodiments, a dry etching technique is used to etch the metal layer. Examples of the dry etching techniques include but are not limited to Reactive Ion Etching (RIE), Plasma Etching, Ion Beam Etching (IBE), Deep Reactive Ion Etching (DRIE), Inductively Coupled Plasma (ICP) Etching, etc. One or more non-liquid or gas etchants may be used in the dry etching process. Example enchants for etching the second metal layer include but are not limited to Chlorine ($Cl_2$), Boron Trichloride ($BCl_3$), Chlorine Trifluoride ($ClF_3$), a mixture of Oxygen ($O_2$) and Carbon Tetrafluoride ($CF_4$), or a combination thereof.

Figure 5D:
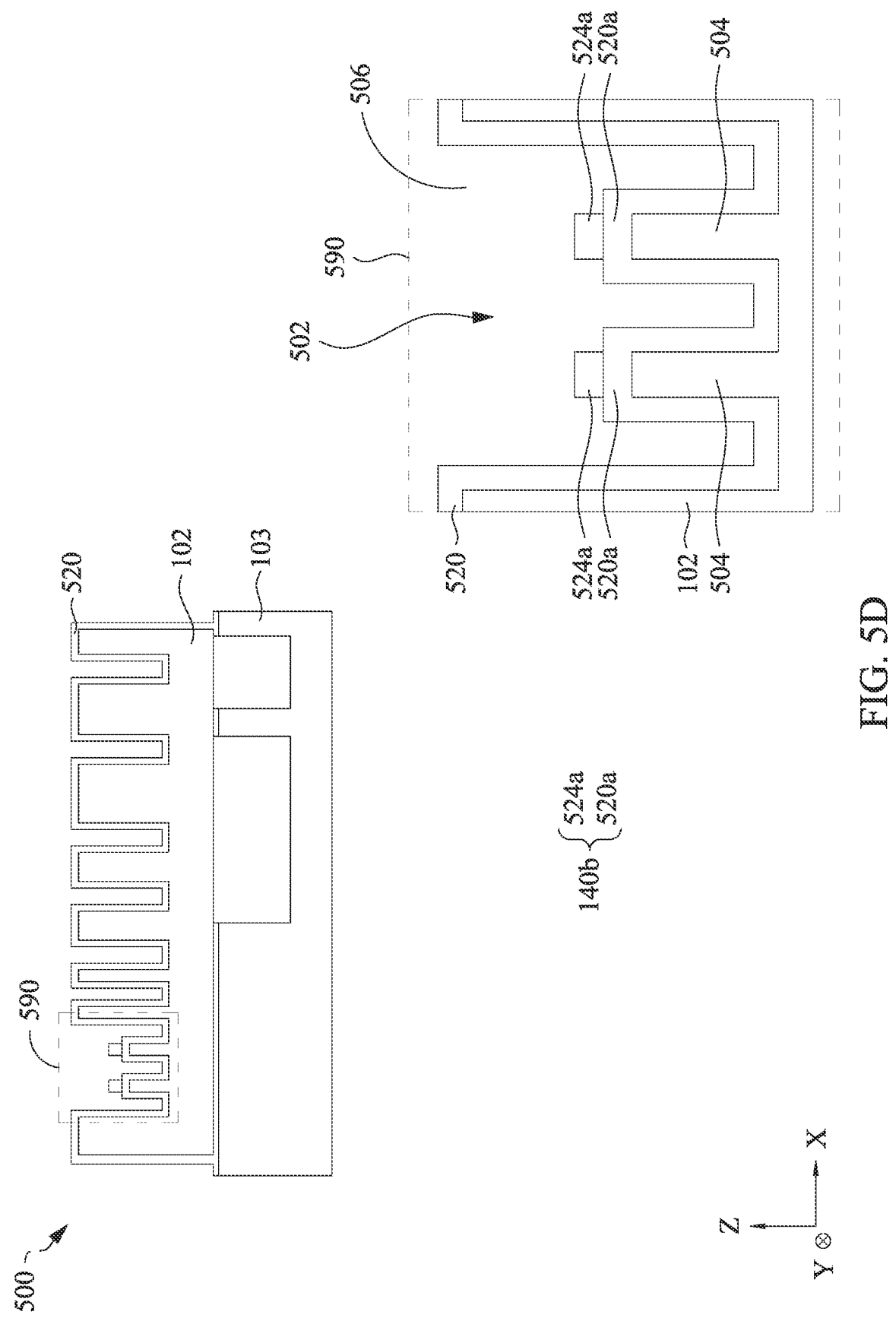

In the example of FIGS. 5C-5D, a patterned mask may be applied on the top of the first metal layer 524 to protect/cover the area of the first metal layer 524 corresponding to and aligned with each protrusion 504 as well as the portions of the first oxide layer 520 disposed on the sidewall 512 thereof. A first dry etching process is performed to remove the unprotected or uncovered first metal layer 524 and form a metal residual layer 524a on the oxide layer 520a corresponding to and vertically aligned with each protrusion 504. In some embodiments, a second etching process may be performed to further control the thickness of the metal residual layer 524a and arrive at a desired thickness. Accordingly, a horizontal bilayer composite structure 140b is formed on each protrusion 504, and the horizontal bilayer composite structure 140b includes the oxide layer 520a and the metal residual layer 524a disposed on the oxide layer 520a. The horizontal bilayer composite structure 140b is disposed on the top surface 510 of the corresponding protrusion 504. The horizontal bilayer composite structure 140b is used as precursor for the formation of the horizontal micro spring structure 150b (shown in FIG. 5S) in subsequent operations. After the dry etching process, the first oxide layer 520 formed in operation 404 is re-exposed and the trench 502 is re-formed.

At 412, a silicon layer is formed. The silicon layer may be formed by performing a two-step process. In some embodiments, a two-step process is performed to form the silicon layer, starting with the deposition of a "seed layer" using a Chemical Vapor Deposition (CVD) technique, followed by the growth of silicon on the seed layer using a thermal deposition technique. In the first step, a thin seed layer of silicon is deposited onto the substrate surface through the CVD process. For example, a precursor gas, such as silane ($SiH_4$), may be introduced into a reaction chamber where it decomposes in the presence of a catalyst or high-energy plasma, to deposit a thin layer of silicon atoms onto the exposed first oxide layer of the base structure. The seed layer may act as a nucleation site for subsequent silicon growth. In the second step, a thermal deposition technique, such as thermal evaporation, is performed to grow a thicker silicon layer on top of the seed layer. A high-temperature environment (e.g., 800 to 1,600° C.) may be used, to evaporate silicon atoms from a source material. A thicker silicon layer is then formed on the thin layer of silicon atoms formed in the first step. In some embodiments, a CMP process may be performed on the silicon layer. In the example shown in FIG. 5E, the silicon layer 526 is formed on the re-exposed first oxide layer 520. The silicon layer 526 also fills the re-formed trench 502 and covers the horizontal bilayer composite structure 140b.

At 414, the silicon layer is etched to form silicon residual layers respectively on the horizontal bilayer composite structure. Similar to operation 410, a suitable dry etching technique is used to etch the metal layer to remove the desired portion of the silicon layer and form a silicon residual layer on the metal residual layer of each horizontal bilayer composite structure.

Figure 5E:
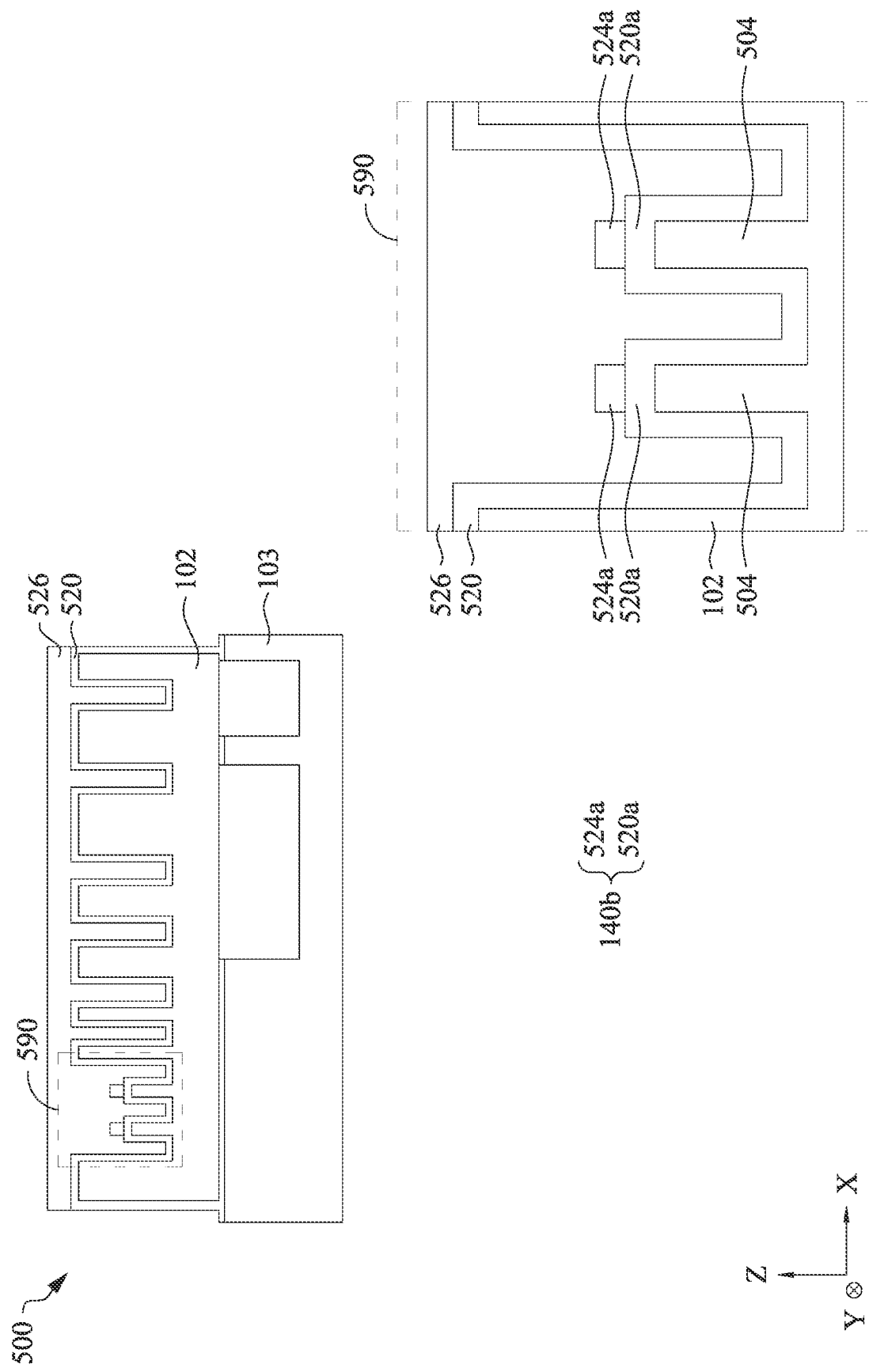
Figure 5F:
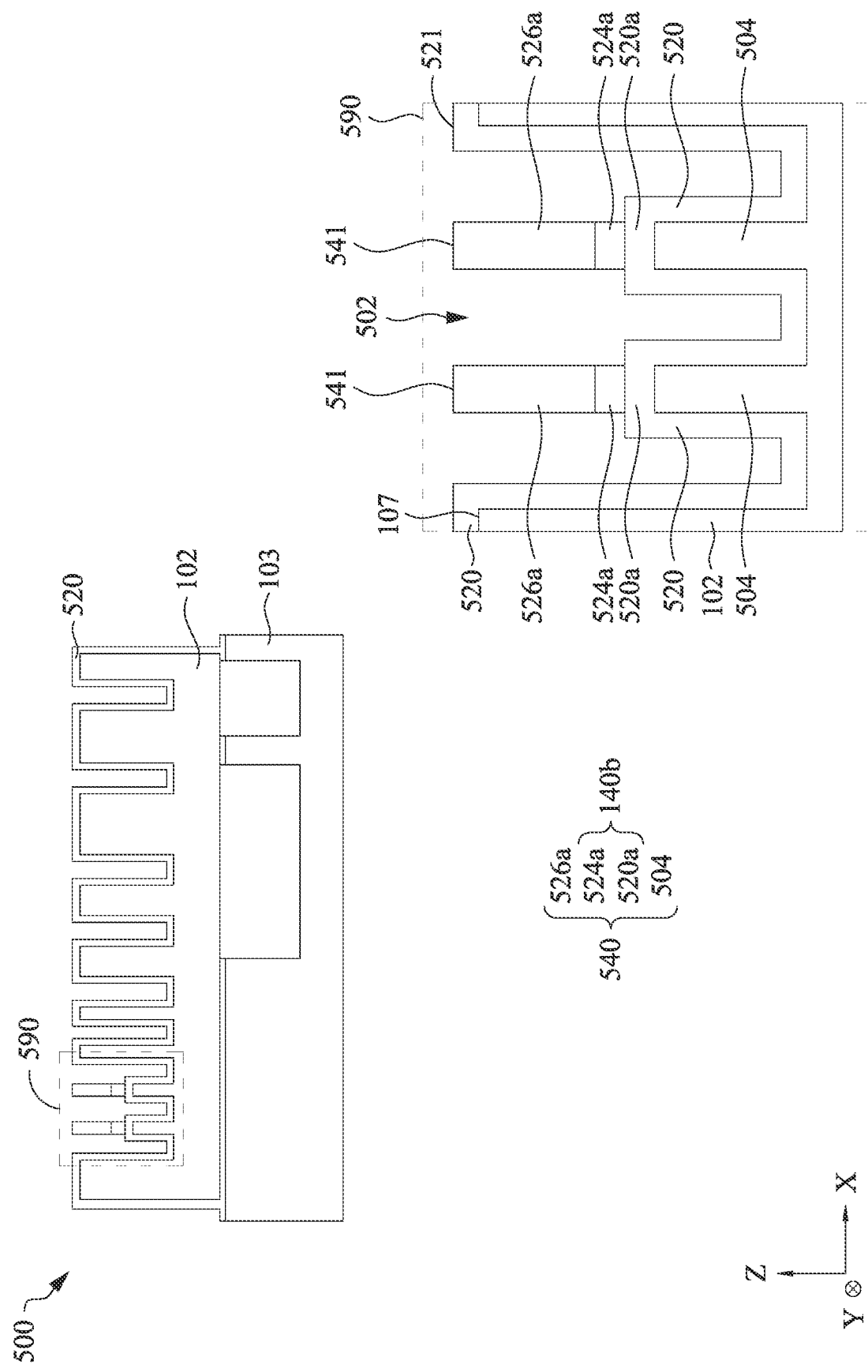

In the example of FIGS. 5E-5F, the patterned mask used in operation 410 may be re-applied on the base structure 500 to protect the area of the silicon layer 526 corresponding to and vertically aligned with the protrusions 504. Then a dry etching process is performed to remove the portion of the silicon layer 526 corresponding to the exposed regions defined by the patterned mask. As a result, silicon residual layers 526a are formed respectively corresponding to the protrusions 504. Each silicon residual layer 526a is formed on the metal residual layer 524a of the corresponding horizontal bilayer composite structure 140b. After dry etching, the first oxide layer 520 is re-exposed and the trench 502 is re-formed. Each silicon residual layer 526a extends downwardly from the top open end 506 of the trench 502 to the top surface of the metal residual layer 524a. Each silicon residual layer 526a is vertically aligned with the metal residual layer 524a and the underlying protrusion 504, and their horizontal dimensions are substantially the same. Each silicon residual layer 526a may have a top surface substantially coplanar with the top surface of the first oxide layer 520. For purposes of simplicity, each protrusion 504, the corresponding horizontal bilayer composite structure 140b (i.e., the oxide layer 520a and the metal residual layer 524a), as well as the silicon residual layer 526a formed on the corresponding horizontal bilayer composite structure 140b form a heterogeneous structure 540 extending downwardly from a top surface 541 to the bottom surface 508 of the trench 502. The heterogeneous structures 540 are partially covered by the first oxide layer 520 (i.e., the first oxide layer 520 disposed on the sidewalls 512 of the protrusions 504).

At 416, a second oxide layer is formed to cover the silicon residual layer and the metal residual layer on each protrusion. The second oxide layer may be formed in a similar manner as the operation 406. In some embodiments, each silicon residual layer is further etched to further remove a top portion thereof such that the top surface of the silicon residual layer is substantially coplanar with the top surface of the top wafer, before the second oxide layer is formed.

Figure 5G:
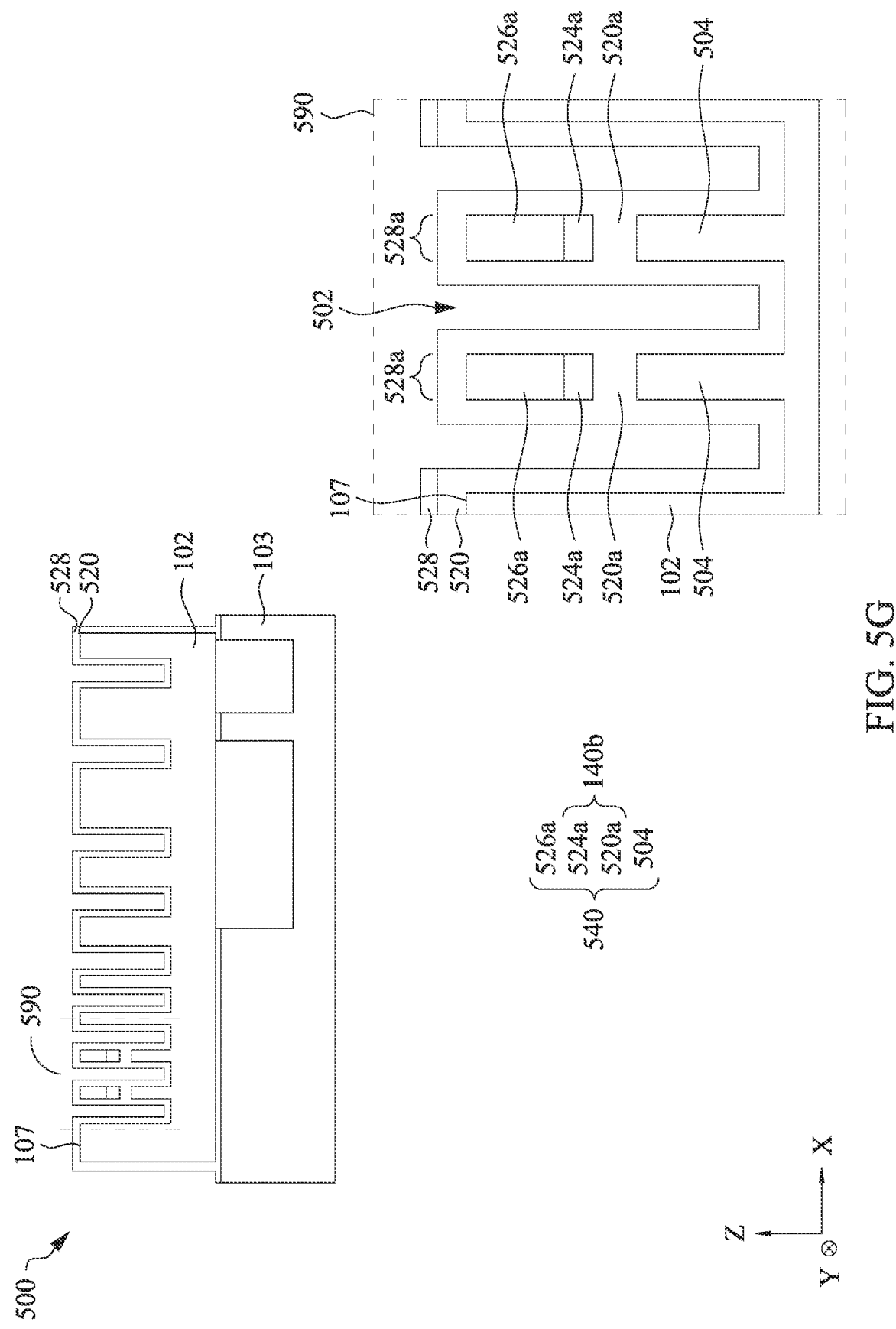

In the example of FIG. 5G, the second oxide layer 528 is formed on the re-exposed first oxide layer 520 and also covers the top surface and the sidewall of the silicon residual layer 526a corresponding to each protrusion 504. Before the second oxide layer 528 is formed, each silicon residual layer 526a is further etched to remove a small top portion thereof such that the top surface 541 of the silicon residual layer 526a is substantially coplanar with the top surface 107 of the top wafer 102. As such, the second oxide layer 528 and the first oxide layer 520 covers the sidewall and the top surface of each heterogenous structure 540 entirely. The portion of the second oxide layer 528 directly formed on the top surface 541 of the silicon residual layer 526a is denoted as 528a.

At 418, a first polysilicon layer is formed to form a major body portion of each to-be-generated micromechanical arm. The first polysilicon layer may be formed using suitable techniques such as thermal deposition or atom layer deposition (ALD). For example, a silicon-containing gas such as SiH$_4$ or SiH$_2$Cl$_2$ may be used as a precursor to form the polysilicon layer on the base structure placed in a thermal tube at high temperature. Likewise, an ALD process may be performed to form the polysilicon layer using the silicon-containing gas precursor and deposit the polysilicon layer on the base structure.

Figure 5H:
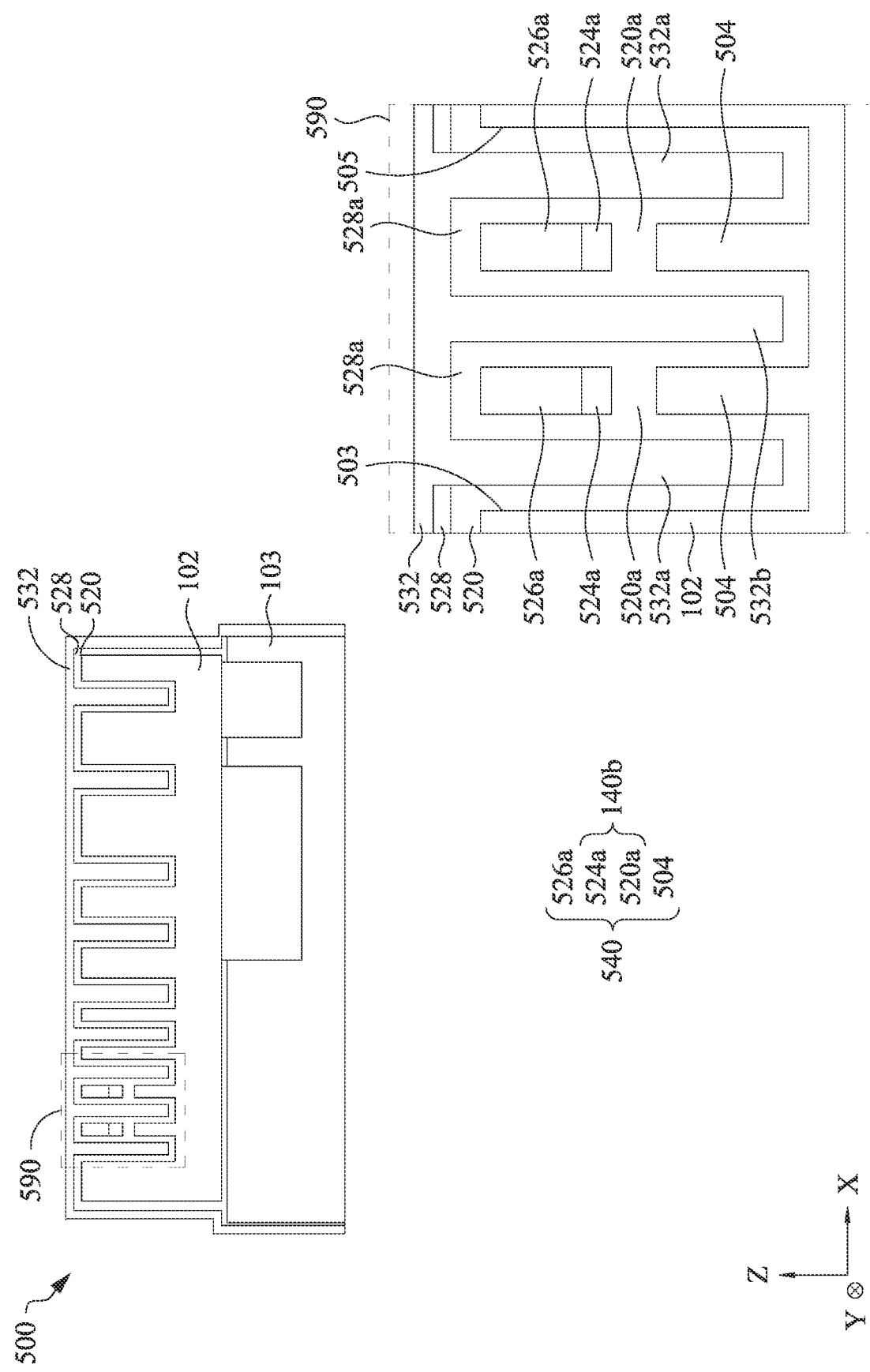
Figure 51:
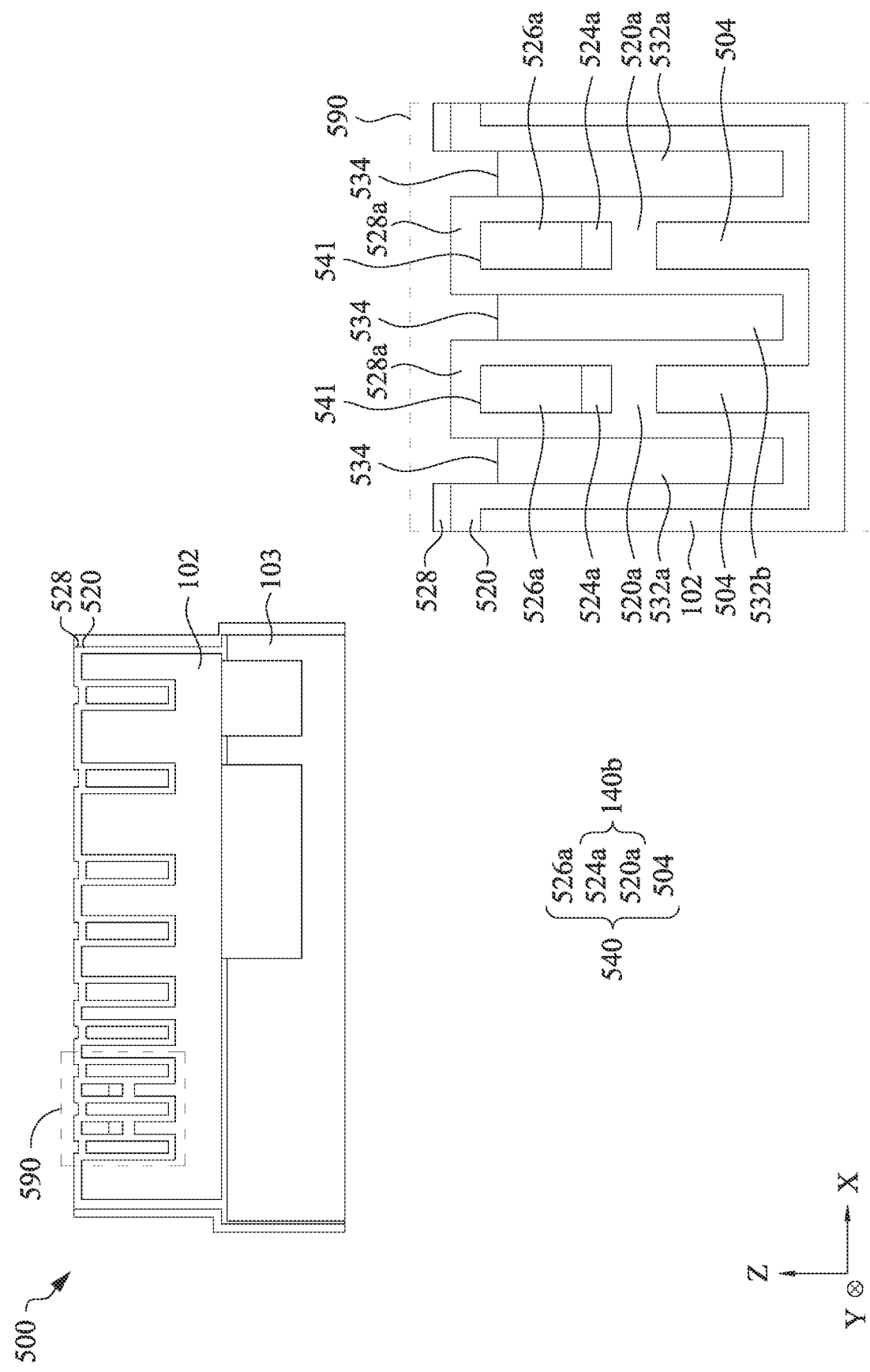

In the example of FIGS. 5G-5H, the first polysilicon layer 532 is formed and deposited on the second oxide layer 528. The first polysilicon layer 532 also fills the trench 502. Multiple polysilicon portions 532a may be formed, which serve as the major body of the micromechanical arms formed in subsequent operations. For example, the space in the trench 502 between the sidewall 503 and the neighboring heterogeneous structure 540 is filled with a portion of the first polysilicon layer 532, denoted as polysilicon portion 532a, which later serves as the major body 123 of a first micromechanical arm 112a (shown in FIG. 5J). The space in the trench 502 between two neighboring heterogeneous structures 540 is filled with a portion of the first polysilicon layer 532, denoted as polysilicon portion 532b, which later serves as the major body 123 of a second micromechanical arm 112b (shown in FIG. 5J). Likewise, the space in the trench 502 between the sidewall 505 the neighboring heterogeneous structure 540 is filled with a portion of the first polysilicon layer 532, denoted as polysilicon portion 532a, which later serves as the major body 123 of another first micromechanical arm 112a (shown in FIG. 5J). Accordingly, the two heterogenous structures 540 are interposed in the multiple polysilicon portions 532a/532b/532a. It should be understood that the number of the heterogeneous structures 540 and the polysilicon portions 532a/532b may vary. For example, more than two heterogenous structures 540 and more than three polysilicon portions 532a/532b may be formed.

At 420, the first polysilicon layer is etched to form a top surface of the polysilicon portion below the top surface of the second oxide layer. In some embodiments, a two-step process is performed. First, a CMP process is performed to remove excess material of the first polysilicon layer and to expose a top surface of each polysilicon portion. Second, a patterning and etching process is performed to remove a small top portion of each polysilicon portion to form a top surface that is below the top surface of the silicon residual layer. In some embodiments, a wet etching technique may be utilized to etch off small top portion of each major body portion. As shown in FIG. 5I, after etching the first polysilicon layer, the second oxide layer 528 is re-exposed, and a top surface 534 of each polysilicon portion 532a/532b is exposed and below the top surface 541 of the silicon residual layer 526a of the corresponding heterogenous structures 540.

Figure 5J:
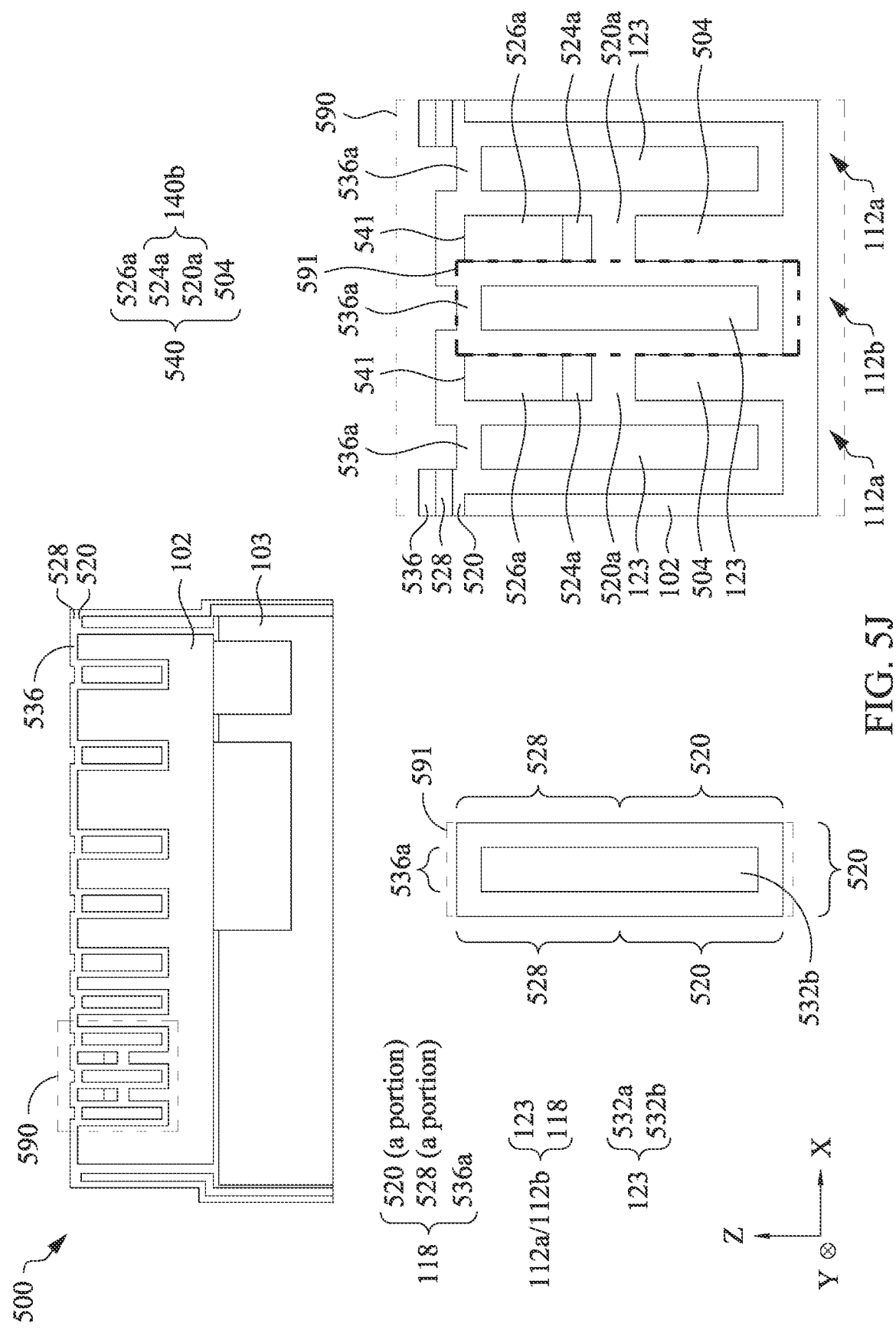

At 422, a third oxide layer is formed. The third oxide layer is formed and deposited on the top surface of the polysilicon portions. The third oxide layer may be formed in a similar manner as forming the first and second oxide layers in the operations 406 and 416, respectively. In the example of FIG. 5J, the third oxide layer 536 is formed on the re-exposed first oxide layer 520 and also covers the top surface 534 of each polysilicon portion 532a/532b. The portion of the third oxide layer 536 formed on the top surface 534 of each polysilicon portion 532a/532b is denoted as 536a. As shown in the region 590, each polysilicon portion 532a/532b is entirely covered by oxide derived from a portion of the first oxide layer 520 (disposed on and covering the sidewall 503/505 and the bottom surface 508 of the trench 502 as well as the sidewall of the protrusion 504), a portion of the second oxide layer 528 (disposed on and covering the sidewalls of the residual metal layer 524a and the silicon residual layer 526a), and the third oxide layer portion 536a (disposed on and covering the top surface 534 of the polysilicon portion 532a/532b). These portions of the first, second, and third oxide layers that cover each polysilicon portion 532a/532b together form the cover layer 118 for each polysilicon portion 532a/532b. Accordingly, the micromechanical arms 112a and 112b are formed. Each one of the micromechanical arms 112a and 112b includes a polysilicon portion 532a/532b as well as the cover layer 118 disposed thereon.

Figure 5K:
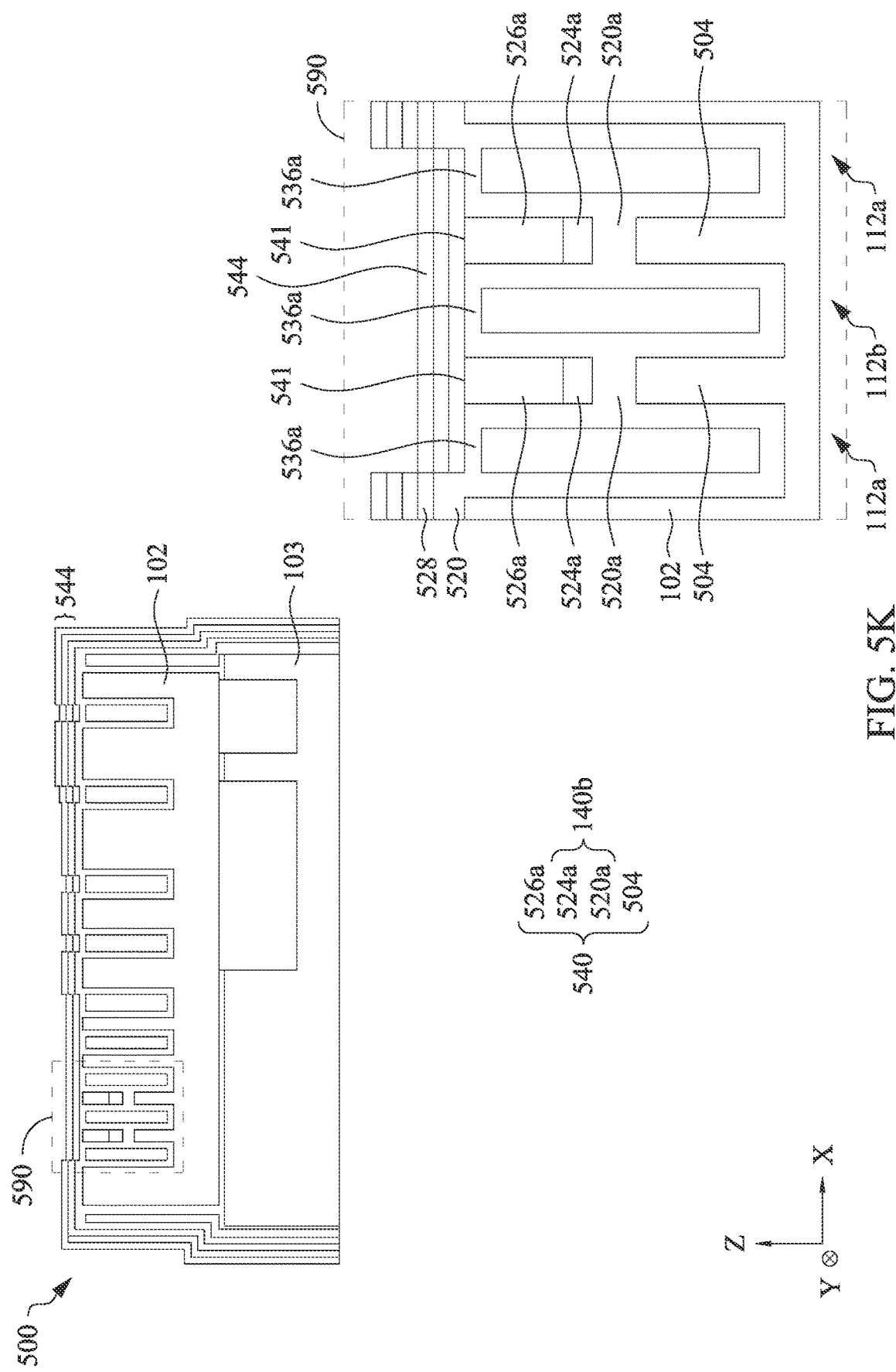

At 424, a multi-layer structure having alternating polysilicon layers and oxide layers is formed. In some embodiments, a patterning and etching process is performed to expose the top surface of each silicon residual layer, before the multi-layer structure is formed. The multi-layer structure may be formed by sequentially and alternatingly depositing a polysilicon layer and an oxide layer to cover the exposed top surface of each silicon residual layer. In the example of FIG. 5K, the top surface 541 of each silicon residual layer 526a (i.e., also the top surface of each heterogeneous structure 540) is exposed before a multi-layer structure 544 is formed. The multi-layer structure 544 is formed and deposited on the top wafer 102 to cover the top surface of each silicon residual layer 526a as well as the third oxide layer 536a on each polysilicon portion 532a/532b. In some embodiments, an etching process may be performed to remove the oxide layer 528a on the top surface of the silicon residual layer 526a to expose the top surface of the silicon residual layer 526a, before the multi-layer structure is formed.

Figure 5L:
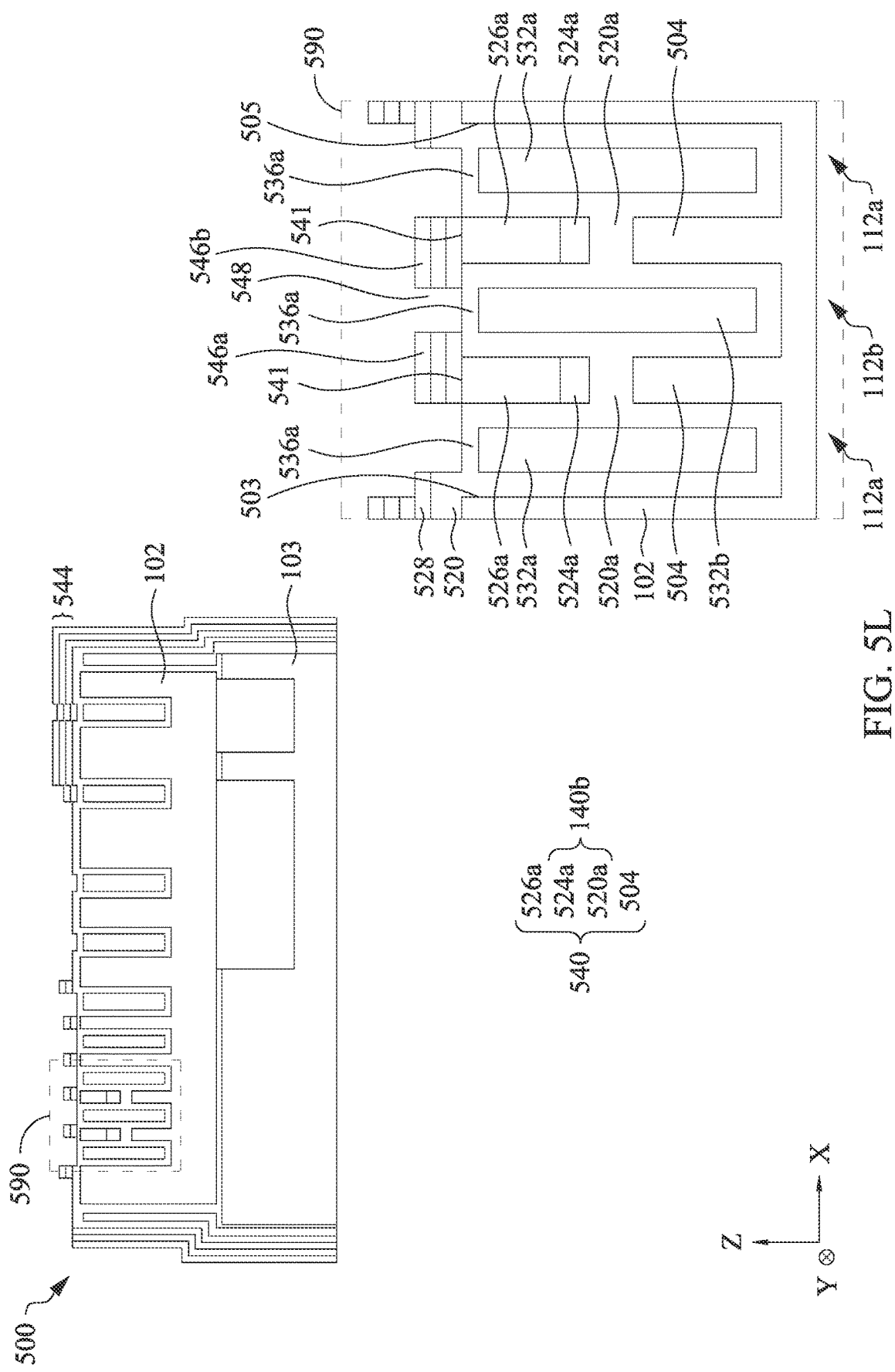

At 426, the multi-layer structure is etched to form multiple spacers respectively on the top surfaces of the silicon residual layers (or the top surfaces of the heterogenous structures). In some embodiments, a patterning and etching process is performed to remove undesired portions of the multi-layer structure and leave the residuals of the multi-layer structure as the spacers in desired regions. Suitable etching techniques, such as drying etching, plasma etching, or wet etching, may be used to etch the multi-layer structure and form the spacers. A first opening between two neighboring spacers is formed, and the first opening is vertically aligned with the polysilicon portion of one of the micromechanical arms. In the example of FIG. 5L, multiple spacers 546 including a first spacer 546a and a second spacer 546b are formed as residuals of the multi-layer structure 544. The first spacer 546a is disposed on and substantially aligned with the heterogeneous structure 540 (proximate to the sidewall 503) in the vertical direction, and the second spacer 546b is disposed on and substantially aligned with the heterogeneous structure 540 (proximate to the sidewall 505) in the vertical direction. A first opening 548 is formed between the first and the second spacers 546a and 546b. The first opening 548 is substantially aligned with the polysilicon portion 532b of the second micromechanical arm 112b, and the third oxide layer portion 536a disposed on the polysilicon portion 532b is exposed to the opening 548.

Figure 5M:
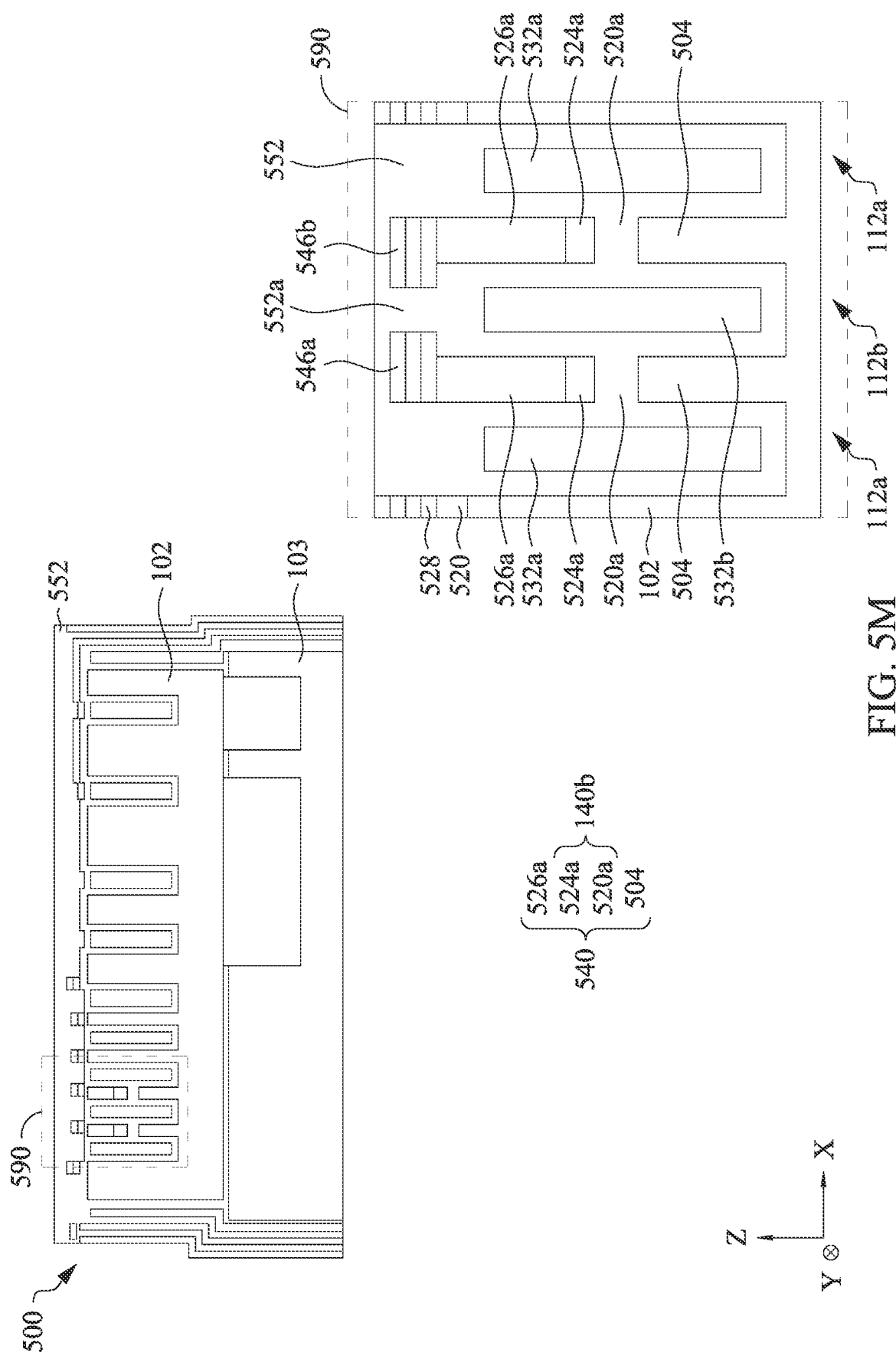

At 428, a fourth oxide layer is formed. The fourth oxide layer is formed on the top wafer and fills the first opening between two neighboring spacers. The fourth oxide layer may be formed in a similar manner as forming the first, second, and third oxide layers in the operations 406, 416, and 422, respectively. In the example of FIGS. 5L-5M, the fourth oxide layer 552 is formed and deposited on the top wafer 102 to fill the openings between the neighboring spacers 546. The first opening 548 between the first and second spacers 546a and 546b is also filled with a portion of the fourth oxide layer 552, denoted as 552a.

Figure 5N:
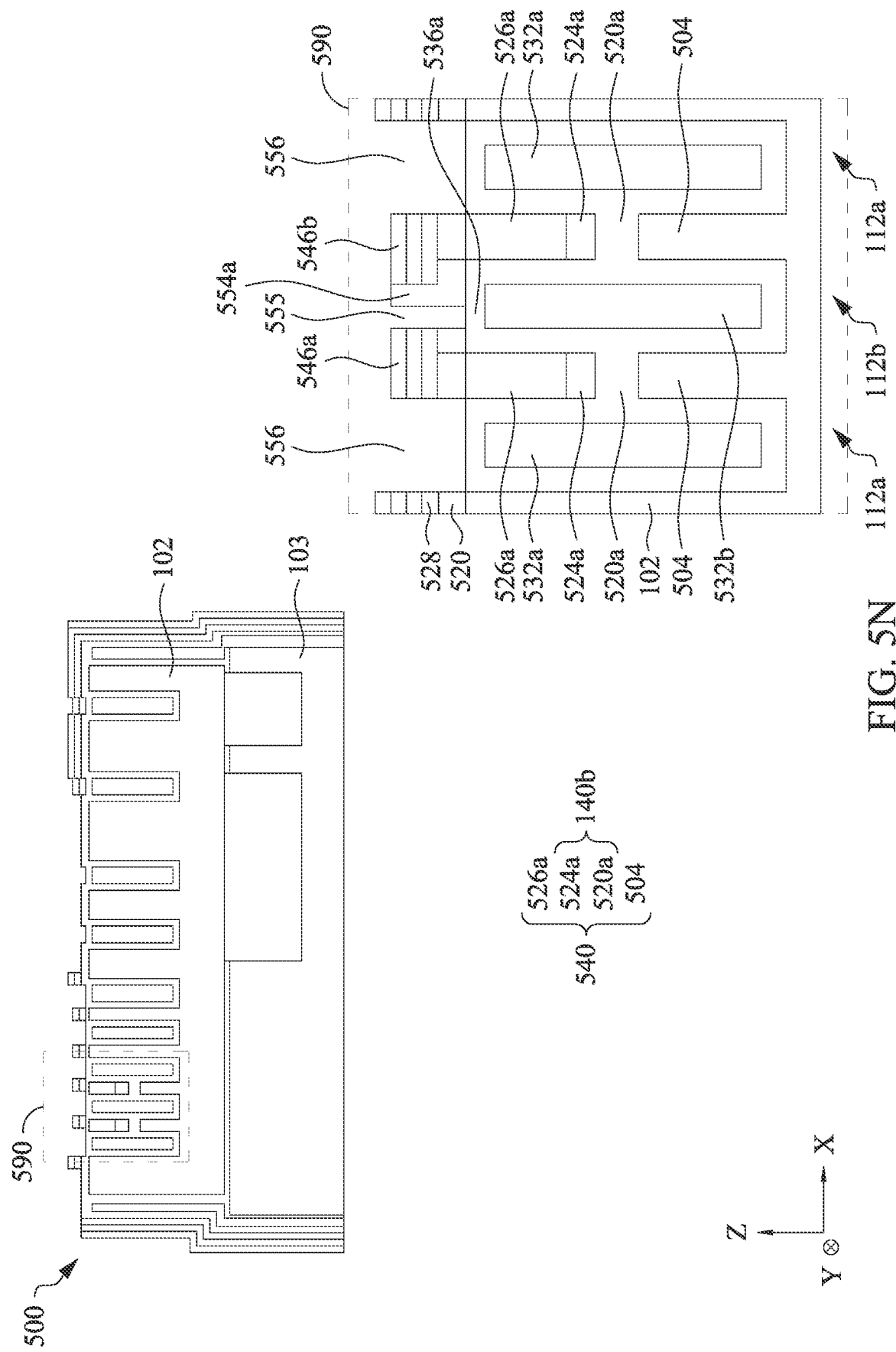
Figure 5O:
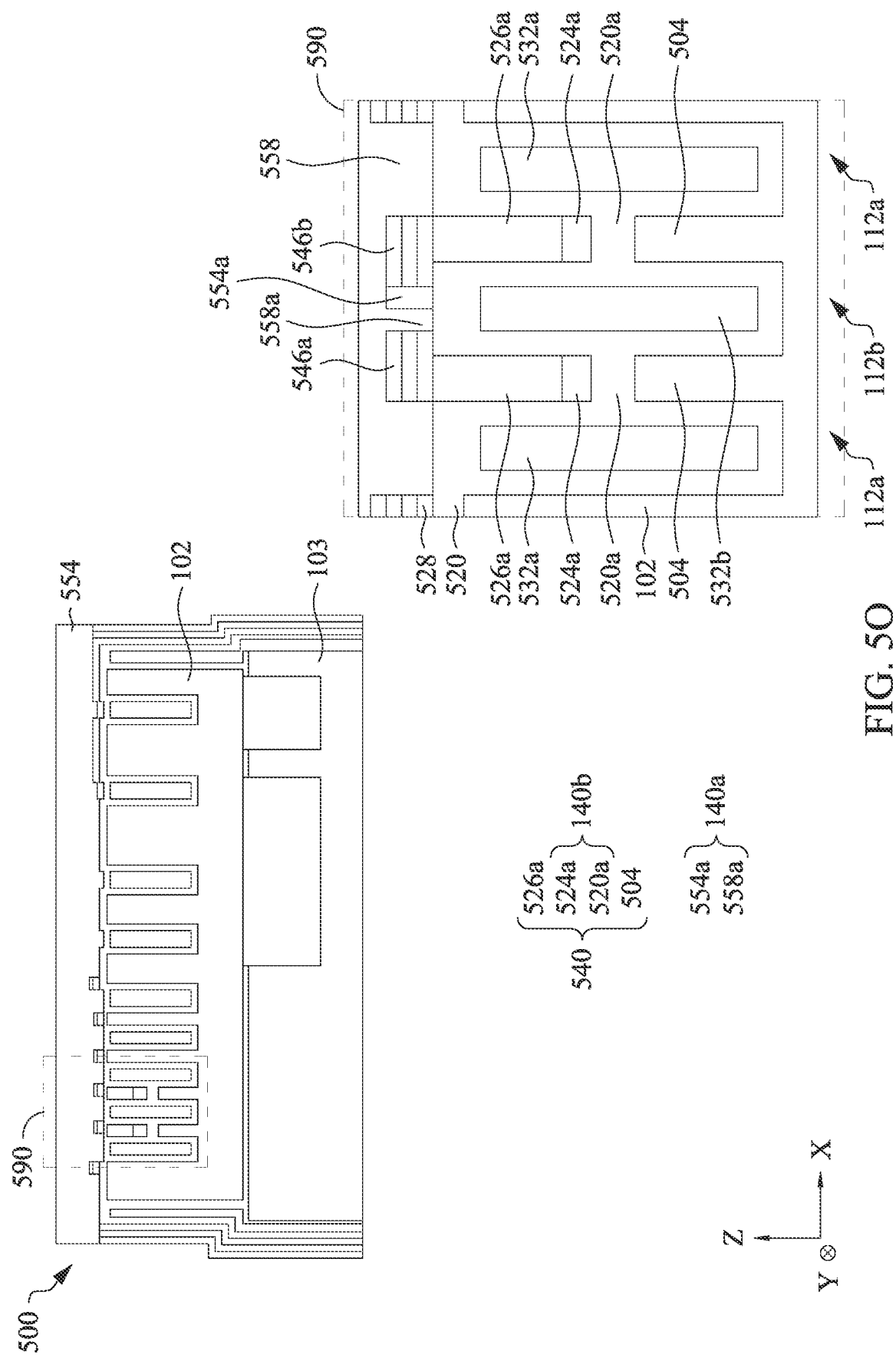

At 430, the fourth oxide layer is etched to form an oxide residual layer and a second opening adjacent to the oxide residual layer. In some embodiments, a patterning and etching process is performed to remove a portion of the oxide layer filled in the first opening between the two neighboring spacers and leave the oxide residual layer therein. Suitable etching techniques, such as drying etching or plasma etching may be used, optionally in combination with appropriate etchants, to etch the fourth oxide layer and form the oxide residual layer. A second opening adjacent to the oxide residual layer is accordingly formed. The second opening will be used to receive and accommodate a metal residual layer, which will be formed in subsequent operations. In the example of FIGS. 5M-5N, the fourth oxide layer 552 is etched to remove a portion of the oxide layer portion 552a disposed on the first opening 548 (FIG. 5L). As a result, the unremoved portion of the oxide layer portion 552a remains in the opening 548 (FIG. 5L) and forms the oxide residual layer 554a. A second opening 555 (i.e., a left portion of the first opening 548 of FIG. 5L) corresponding to the removed portion of the oxide layer portion 552a is formed and adjacent to the oxide residual layer 554a. It should be noted that the relative position of the second opening 555 and the oxide residual layer 554a may vary. For example, the second opening may be in the right and the oxide residual layer 554a may be in the left. Multiple openings 556 may be formed above other micromechanical arms (e.g., the micromechanical arms 112a of FIG. 5N).

At 432, a second metal layer is formed. The second metal layer may be formed in a similar manner as the first metal layer of operation 408. The second metal layer is deposited on the top wafer and also fills the openings between the spacers. As a result, a vertical bilayer composite structure is formed. In some embodiments, the second metal layer is composed of AlCu alloy. In the example of FIGS. 5N-5Q, the second metal layer 558 is formed and deposited on the top wafer 102. The second metal layer 558 fills the openings 556 above the micromechanical arms 112a as well as the opening 555 above the micromechanical arm 112b. The portion of the second metal layer 558 filled in the opening 555 is denoted as 558a, which will serve as a metal residual layer in the subsequent operation. The metal layer portion 558a and the oxide residual layer 554a form a vertical bilayer composite structure 140a aligned with the polysilicon portion 532b of the micromechanical arm 112b.

Figure 5P:
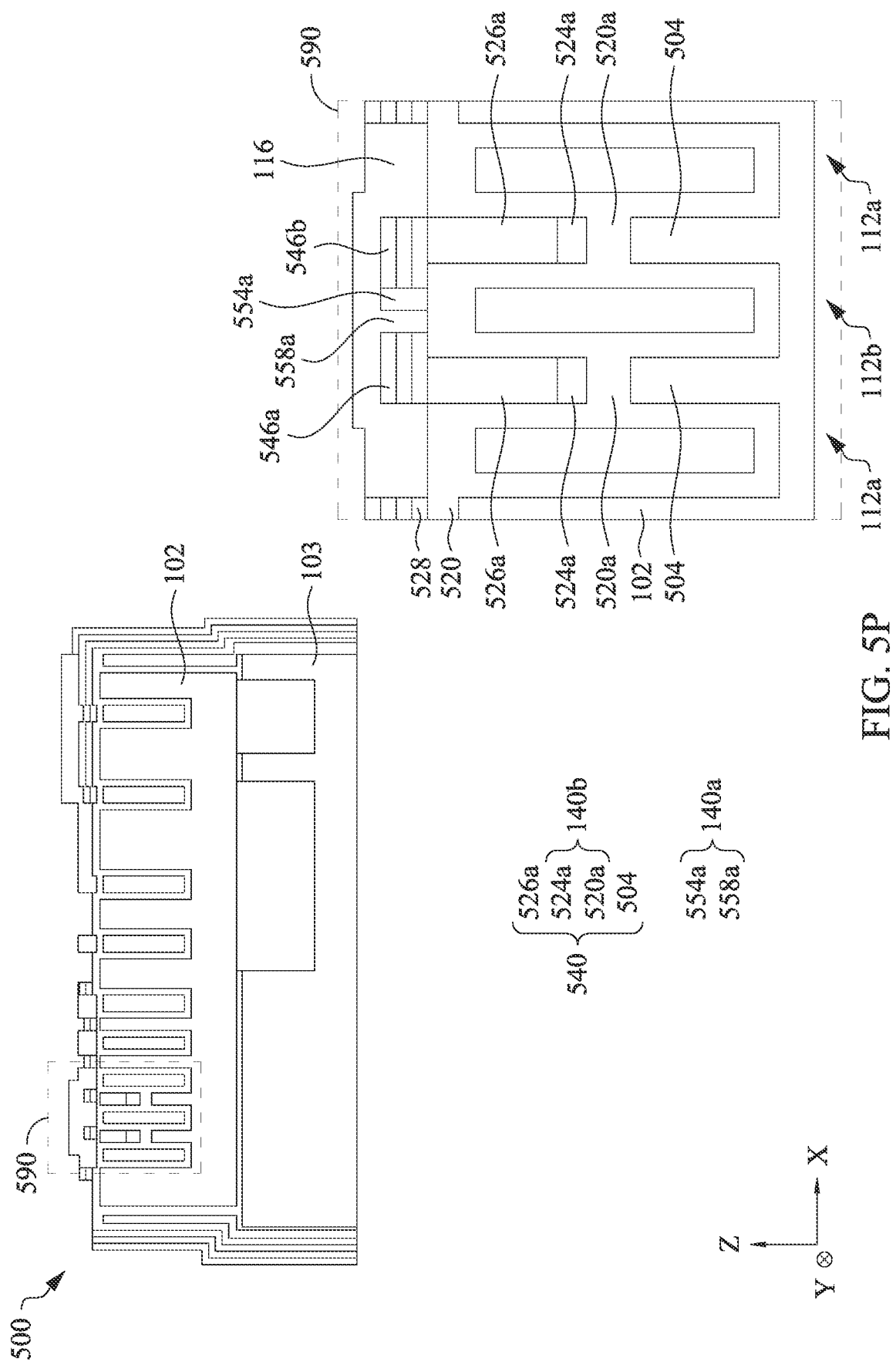

At 434, the second metal layer is etched to form a metal connection structure. In some embodiments, a patterning and etching process is performed, using a suitable etching technique such as dry etching, wet etching, or plasma etching, to remove undesired portions of the second metal layer. In some embodiments, the second metal layer is composed of AlCu alloy. In the example of FIG. 5P, the unremoved portion of the second metal layer 558 forms the metal connection structure 116, which is connected to the first micromechanical arms 112a as well as the vertical bilayer composite structure 140a (i.e., the metal layer portion 558a and the oxide residual layer 554a). Other metal connection structures (not shown) connected to the second micromechanical arms 112b are also formed in the same process.

Figure 5Q:
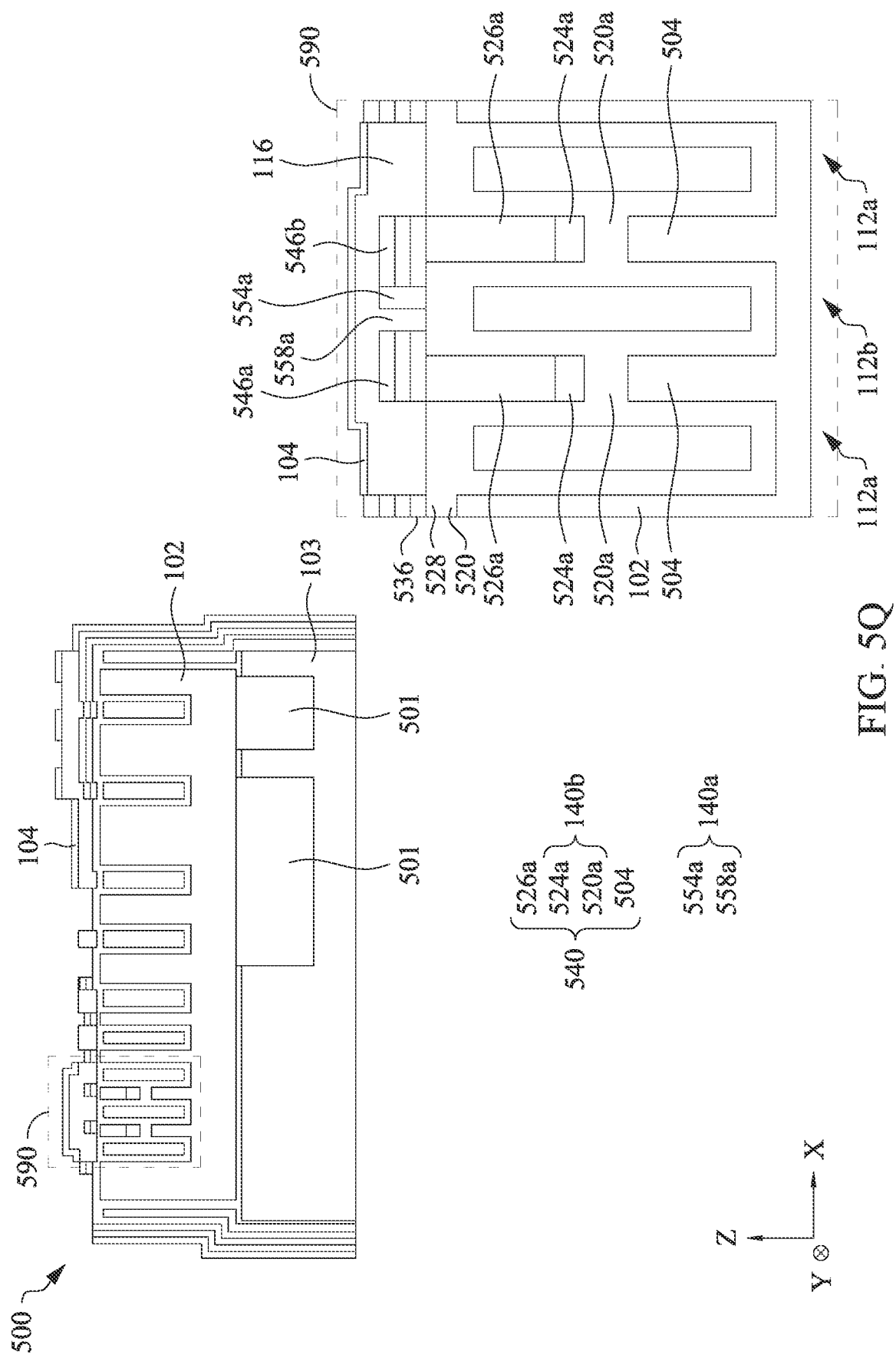

At 436, a passivation layer is formed and deposited on the metal connection structure. The passivation layer may be composed of a dielectric material that acts as a protective barrier, providing insulation and preventing moisture, contaminants, and electrical leakage from affecting the MEMS system. In some embodiments, the passivation layer may be composed of silicon oxide ($SiO_2$), silicon nitride ($Si_3N_4$), silicon oxynitride (SiON), aluminum oxide ($Al_2O_3$), titanium nitride (TiN), or a combination thereof. The passivation layer may be formed by using a suitable deposition technique such as CVD, low-pressure CVD (LPCVD), plasma-enhanced CVD (PECVD), PVD, PEPVD, ALD, PEALD, and so on. In the example of FIG. 5Q, the passivation layer 104 is formed and deposited on the metal connection structure 116.

At 438, a silicon release process is performed to remove the silicon and the spacers (i.e., the unremoved multi-layer structure) to form a continuous cavity. The silicon release process is sometimes also referred to as a "sacrificial release process." The silicon release process is a process where a structure is formed on the sacrificial layer that is later removed to leave a gap between the structure and a stop layer under the sacrificial layer. In one example, the sacrificial layer is made of silicon or polysilicon, and the stop layer is made of silicon oxide (e.g., the first, second, third, and fourth oxide layer). The sacrificial layer, which may be made of poly, is later etched using, for example, plasma etching. Sulfur hexafluoride ($SF_6$), for example, can be used as the etchant. During the plasma etching, a fraction of the sulfur hexafluoride breaks down into sulfur and fluorine, with the fluorine ions performing a chemical reaction with the sacrificial layer, which is made of polysilicon. It should be understood that the examples above are not intended to be limiting, and other materials, etchants, etching processes can be employed as needed.

In some embodiments, a release aperture is fabricated using, for example, various lithography and etch techniques. The release aperture then provides access to the sacrificial layer for the etchant used in the sacrificial release process. The etchant starts etching through the release aperture and etches its way into the cavity. The size of the release aperture, along with other parameters such as the temperature, determines the etch rate of the sacrificial layer and can be designed accordingly. It should be understood that the above examples are not intended to be limiting. In some implementations, multiple release apertures can be used.

Figure 5R:
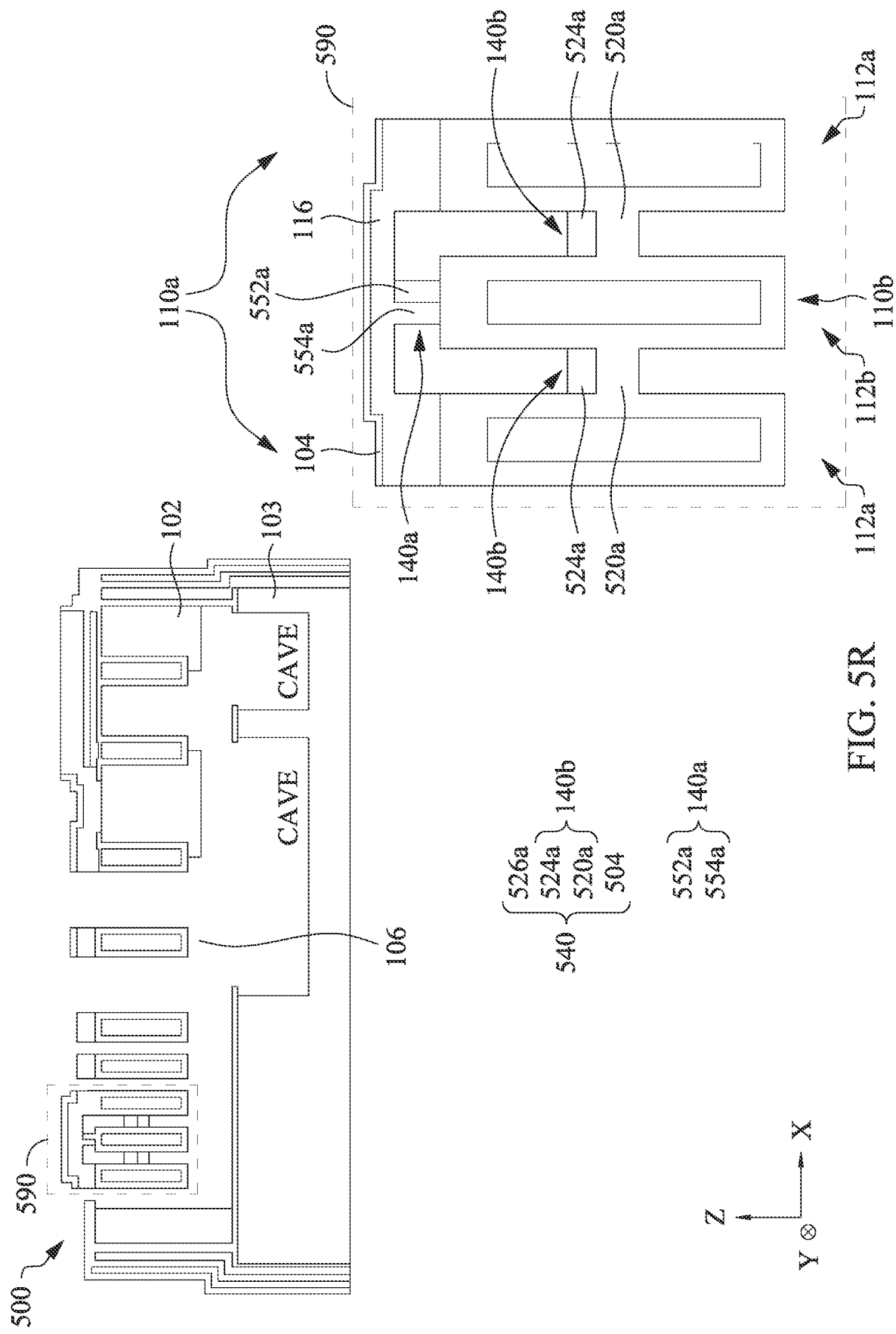
Figure 5S:
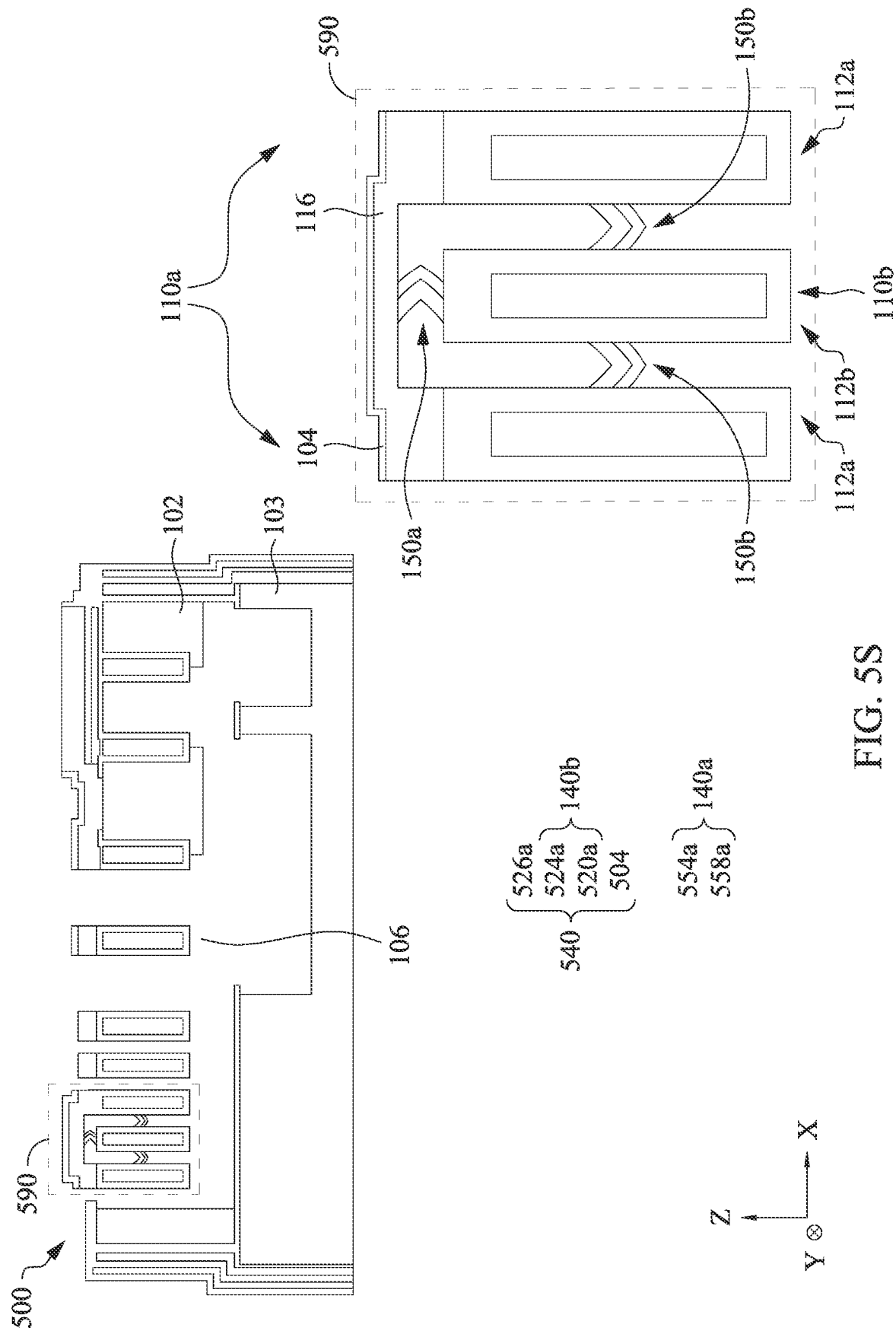

In the example of FIG. 5Q-5R, selected portions of the top wafer 102, selected portions of the heterogeneous structures 540 (i.e., the protrusions 504 and the silicon residual layers 526a), as well as the spacers 546 are respectively removed in the silicon release process. Accordingly, a continuous cavity 106 is formed and also connected to the cavities 501 in the base structure of FIG. 5A, and the first micromechanical arm array 110a and the second micromechanical arm array 110b are formed. The first and second micromechanical arms 112a and 112b are disposed in the cavity 106. The horizontal bilayer composite structures 140b and the vertical bilayer composite structure 140a are also disposed in the cavity 106. The horizontal bilayer composite structures 140b are disposed between and interconnecting the two neighboring micromechanical arms, and the vertical bilayer composite structure 140a is disposed between and interconnecting the metal connection structure 116 and the second micromechanical arm 112b.

At 440, an annealing process is performed to form micro spring structures. The annealing process may be performed in a thermal chamber at an elevated temperature (e.g., 800 to 1,600° C.) to transform the horizontal bilayer composite structures 140b and the vertical bilayer composite structure 140a into the horizontal micro spring structure 150b and the vertical micro spring structure 150a, respectively, according to the example mechanism illustrated in FIG. 2D.

Figure 6:
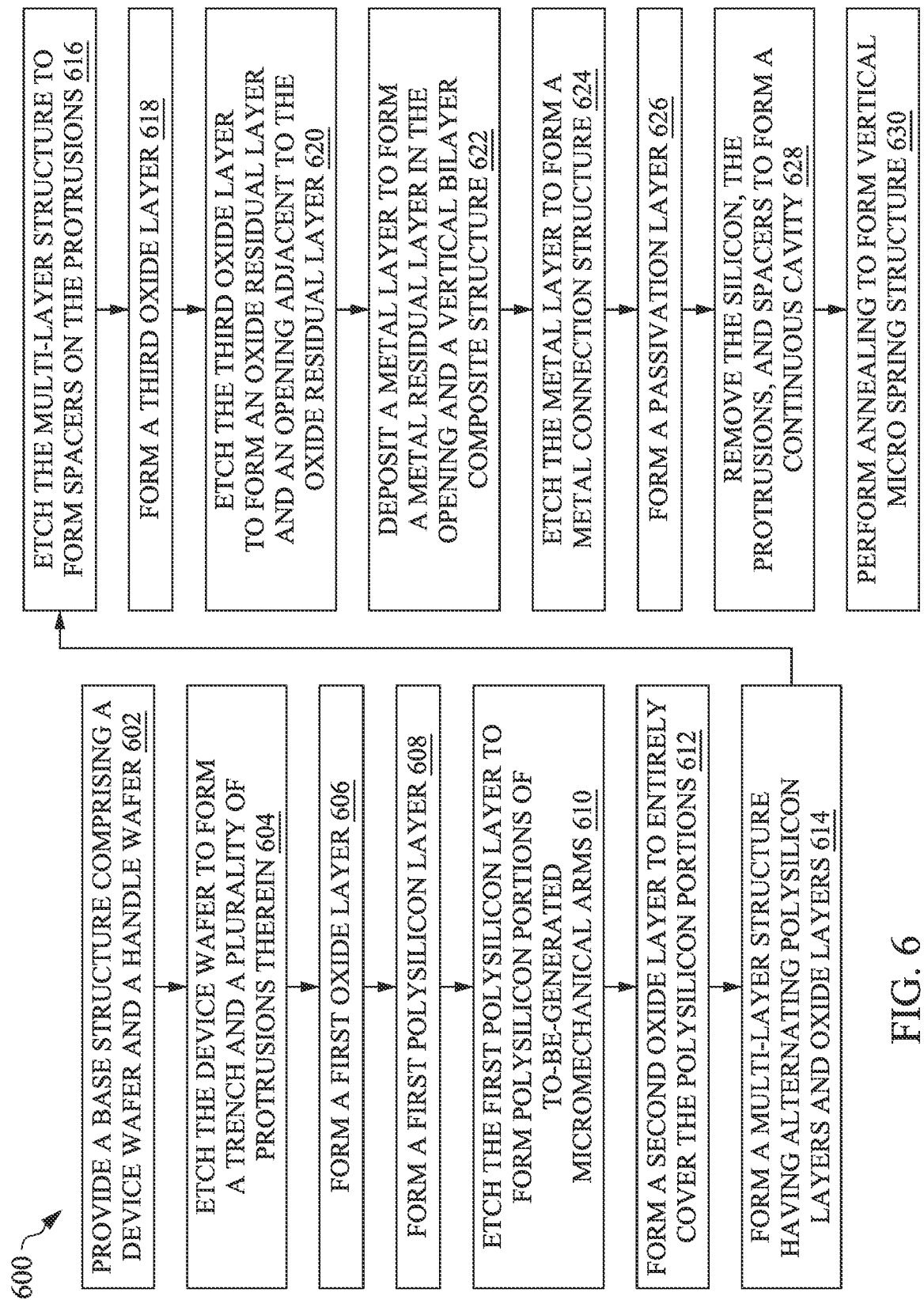
FIG. 6 is a flow diagram illustrating another exemplary method of forming a MEMS system in accordance with some embodiment.

FIG. 6 is a flowchart diagram illustrating an example method for fabricating a MEMS system 700 in accordance with some embodiments. The method 600 is a close variation of the method 400 and may be used to form only the vertical micro spring structure. Various aspects of the operations included in the method 600 are similar to the operations of method 400 and will not be repeated here unless otherwise indicated.

In the example shown in FIG. 6, the method 600 includes operations 602, 604, 606, 608, 610, 612, 614, 616, 618, 620, 622, 624, 626, 628, and 630. Additional operations may be performed. Also, it should be understood that the sequence of the various operations discussed above with reference to FIG. 6 is provided for illustrative purposes, and as such, other embodiments may utilize different sequences. These various sequences of operations are to be included within the scope of embodiments. FIGS. 7A-7H are schematic diagrams illustrating cross-sectional views of a region of the MEMS system 700 at various stages of fabrication of the MEMS system 700 in accordance with some embodiments.

Figures 7A, 7B:
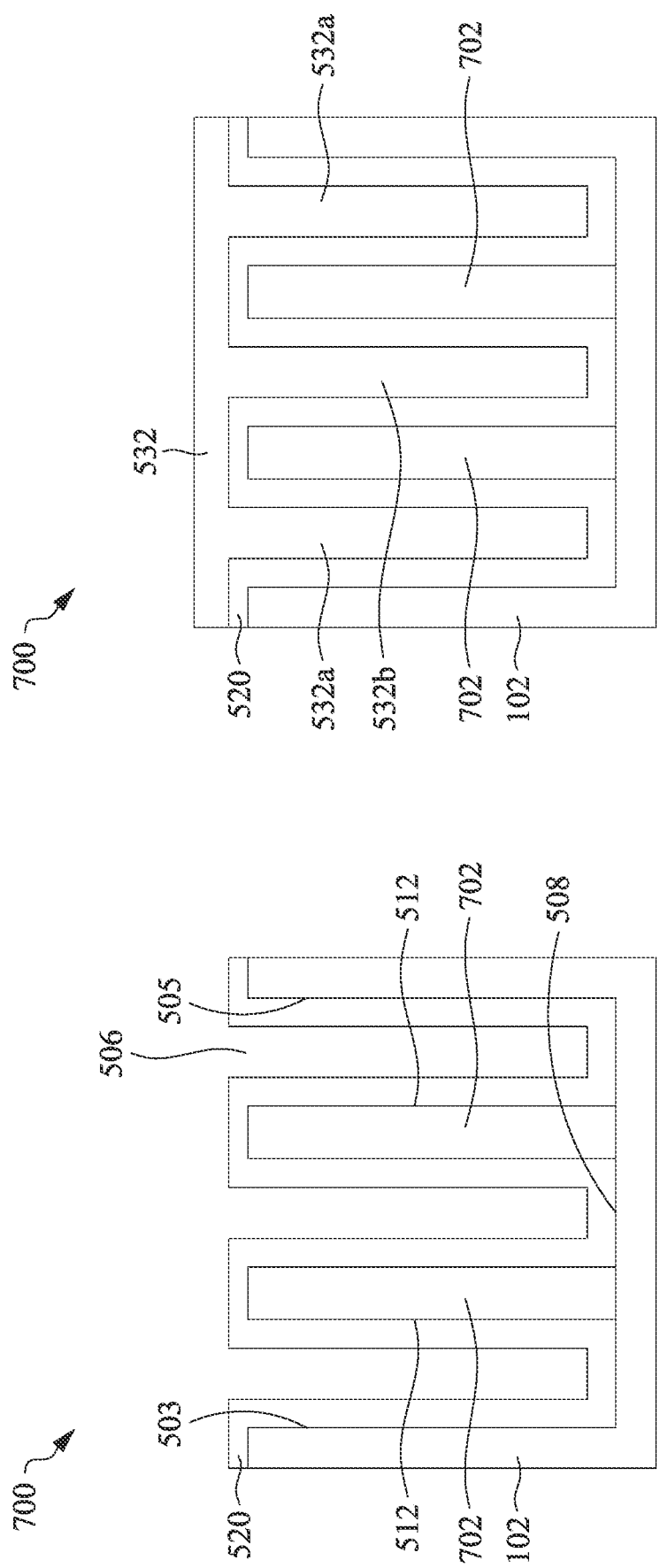

At 602, a base structure comprising a top wafer and a bottom wafer is provided. At 604, the top wafer is etched to form a trench and at least on protrusion therein. At 602, a first oxide layer is formed and deposited in the trench to cover the protrusion. In the example of FIG. 7A, a trench 502 is formed, and the protrusions 702 extend downwardly from the top open end 506 to the bottom surface 508 of the trench 502. The protrusions 702 is similar to the heterogeneous structure 540 shown in FIG. 5F in dimension, but without the horizontal bilayer composite structure 140b formed in the heterogeneous structure 540. The first oxide layer 520 is deposited on the bottom surface 508, sidewalls 503 and 505 of the trench 502, as well as the top surface and sidewall of each protrusion 702.

At 608, a first polysilicon layer is formed to fill the trench. In the example of FIG. 7B, the first polysilicon layer 532 is deposited to fill the space between the sidewall 503/505 of the trench and the neighboring protrusion 702 as well as the space between two neighboring protrusions 702.

Figures 7C, 7D:
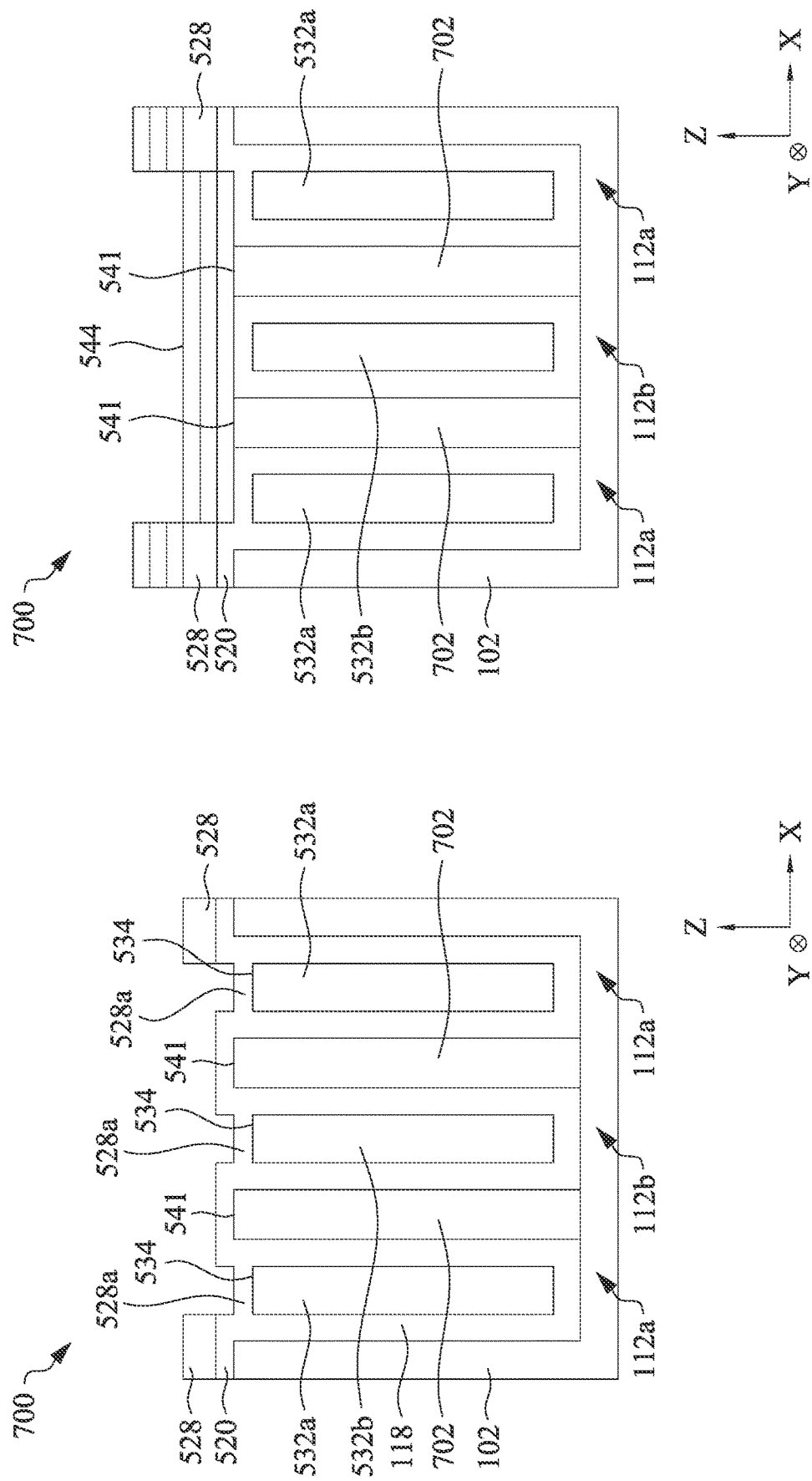

At 610, the first polysilicon layer is etched to form polysilicon portions for the to-be-generated micromechanical arms. At 612, a second oxide layer is formed to cover the polysilicon portions entirely to form micromechanical arms. In the example of FIG. 7C, the first polysilicon layer 532 is etched to form the polysilicon portions 532a and 532b. An additional etching step may be performed to remove a top small portion of each polysilicon portion 532a/532b, such that the top surface of the polysilicon portions 532a/532b is below the top surface 541 of the protrusions 702 in the vertical direction. The second oxide layer 528 is formed to cover the top surface of each polysilicon portion 532a/532b, such that each polysilicon portion 532a/532b is entirely covered by the first and second oxide layers 520 and 528. Thus, the cover layer 118 is formed and disposed on each polysilicon portion 532a/532b, and the micromechanical arms 112a and 112b are accordingly formed.

At 614, a multi-layer structure is formed. In the example of FIG. 7D, a patterning and etching process is performed to expose the top surface 541 of each protrusion 702. Then a multi-layer structure 544 is formed on the top surface 541 of the protrusions 702 as well as the top surface of the micromechanical arms 112a and 112b.

At 616, the multi-layer structure is etched to form spacers on the protrusions. In the example of FIG. 7E, multiple spacers including a first spacer 546a and a second spacer 546b are formed respectively on the top surfaces of the protrusions 702. A first opening 548 between the first spacer 546a and the second spacer 546b is also formed.

At 618, a third oxide layer is formed and fills the first opening between the two spacers respectively disposed on the top surfaces of the protrusions. At 620, the third oxide layer is etched to form an oxide residual layer and a second opening adjacent to the oxide residual layer. At 622, a metal layer is deposited to form a metal residual layer in the second opening. A vertical bilayer composite structure is accordingly formed. In the example of FIG. 7F, the vertical bilayer composite structure 140a, including the oxide residual layer 704a and the metal residual layer 706a adjacent to the oxide residual layer 704a, is formed on the second micromechanical arm 112b.

Figure 7H:
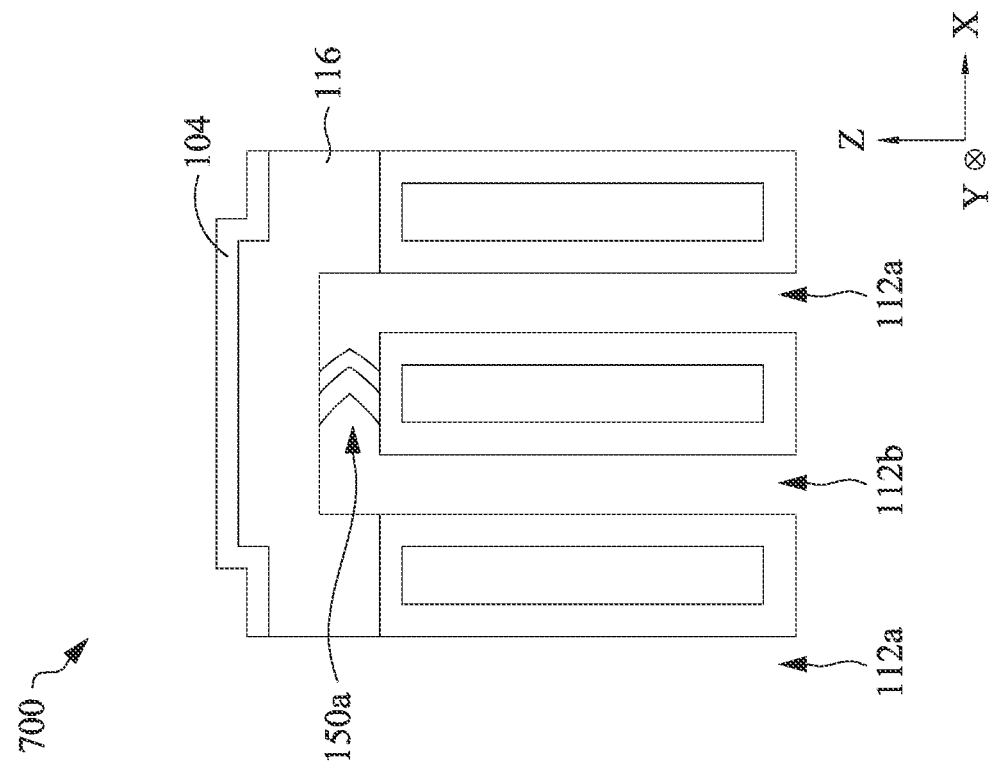
Figure 7G:
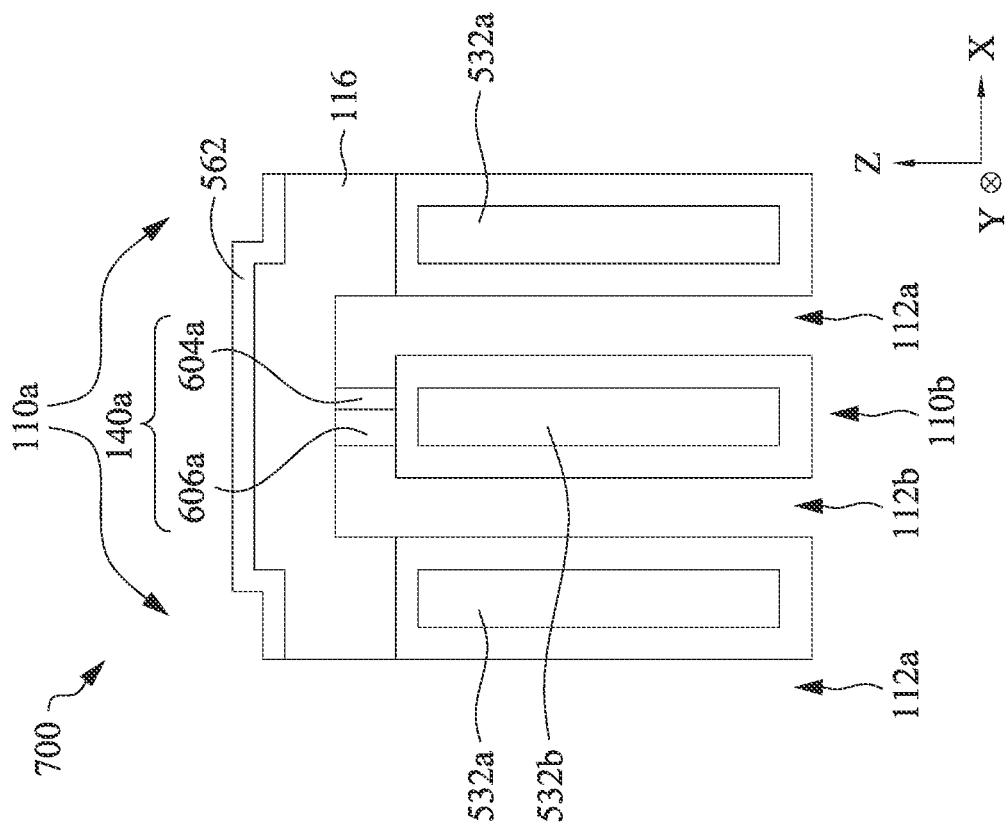

At 624, the metal layer is etched to form a metal connection structure. At 626, a passivation layer is formed on the metal connection structure. At 628, the silicon and spacers are removed by performing a silicon release process to form a continuous cavity and a first micromechanical arm array and a second micromechanical arm array in the cavity. In the example of FIG. 7G, the metal connection structure 116 is formed, and the passivation layer 104 is formed on the metal connection structure 116. Selected portions of the top wafer 102, the protrusions 702, and the spacers 546a and 546b are respectively removed in the silicon release process. Accordingly, the first micromechanical arm array 110a and the second micromechanical arm array 110b are formed. The vertical bilayer composite structure 140a is disposed between and interconnecting the metal connection structure 116 and the second micromechanical arm 112b.

At 630, an annealing process is performed to form vertical micro spring structure. In the example of FIG. 7H, the vertical bilayer composite structure 140a is transformed into the vertical micro spring structure 150a through the annealing process.

Figure 8:
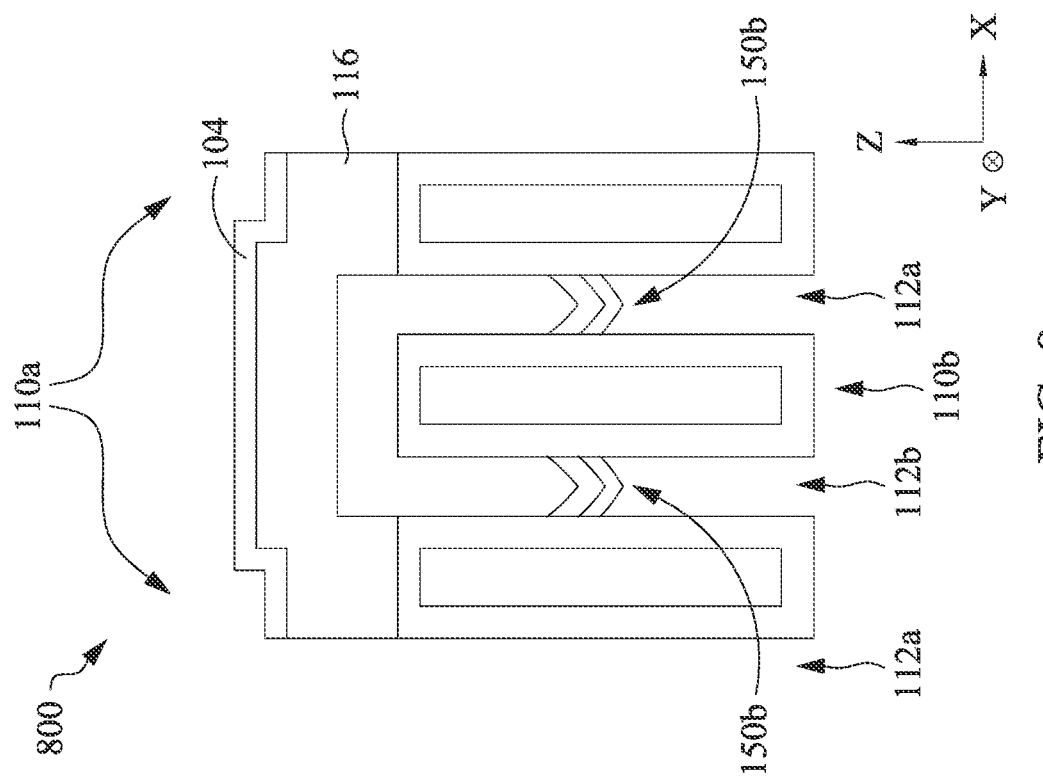
FIG. 8 is a schematic diagram illustrating a cross-sectional view of a portion of another exemplary MEMS system in accordance with some embodiments.

FIG. 8 is a schematic diagram illustrating a cross-sectional view of a portion of an exemplary MEMS system in accordance with some embodiments. In the illustrated example, the MEMS system 800 includes a MEMS actuator having only horizontal micro spring structures 150*b* between the neighboring micromechanical arms 112*a* and 112*b*. No vertical micro spring structures may be included in the MEMS system 100. The MEMS system 800 having only horizontal micro spring structure(s) may be fabricated using modified method 400, for example, by skipping selected operations (e.g., operations 428 and 430) to bypass the formation of the vertical micro spring structure according to some embodiments.

Example Sensor-Shift OIS System Using the MEMS System

FIG. 9 is a diagram illustrating a sensor-shift OIS system 900 in accordance with some embodiments. The sensor-shift OIS system 900 includes, among other components, the MEMS system 100 like the one shown in FIG. 1, an image sensor 902, and a lens 904.

The image sensor 902 is attached to the MEMS system 100 and is operable to detect and convey information used to make an image. The image sensor 902 converts the variable attenuation of light waves coming through the lens 904 into signals. In one implementation, the image sensor 902 is a charge-coupled device (CCD). In another implementation, the image sensor 902 is a CMOS image sensor (CIS). A CMOS image sensor typically includes a microlens that gathers light, color filters that separate out the red, green, and blue (i.e., "RGB") components, and a photodiode that captures the filtered light. In some examples, the CMOS image sensor is a front-side illumination (FSI) CMOS image sensor. In another example, the CMOS image sensor is a backside illumination (BSI) CMOS image sensor.

As explained above, the MEMS system 100 includes, for example, four MEMS actuators 101*a*, 101*b*, 101*c*, and 101*d* (collectively as MEMS actuators 101), each of which may move in one direction, and the movement is controlled by electrical signals. As a result, the image sensor 902 attached to the MEMS system 100 can be moved accordingly under the control of electrical signals, thus achieving sensor-shift OIS.

SUMMARY

In accordance with some aspects of the disclosure, microelectromechanical system (MEMS) actuators are provided. In one example, a MEMS actuator includes a first micromechanical arm array including multiple first micromechanical arms spaced from each other in a first horizontal direction and extending in a second horizontal direction. The MEMS actuator further includes a second micromechanical arm array including multiple second micromechanical arms spaced from each other in the first horizontal direction and extending in the second horizontal direction. The first micromechanical arm array and the second micromechanical arm array are interposed in the first horizontal direction. The MEMS actuator further includes a metal connection structure extending in the first horizontal direction and connected to a top end of each first micromechanical arm. The MEMS actuator further includes a vertical micro spring structure disposed between the metal connection structure and one of the multiple second micromechanical arms. The vertical micro spring structure includes an upper portion connected to the metal connection structure and a lower portion connected to a top end of the second micromechanical arm. The upper portion and the lower portion are connected at a center of the vertical micro spring structure and form a first corner facing horizontally.

In another example, a MEMS actuator includes a first micromechanical arm array including multiple first micromechanical arms spaced from each other in a first horizontal direction and extending in a second horizontal direction, and a second micromechanical arm array including multiple second micromechanical arms spaced from each other in the first horizontal direction and extending in the second horizontal direction. The first micromechanical arm array and the second micromechanical arm array are interposed in the first horizontal direction. The MEMS actuator further includes a metal connection structure extending in the first horizontal direction, and the metal connection structure is connected to a top end of each first micromechanical arm. The MEMS actuator further includes a vertical micro spring structure disposed between the metal connection structure and at least one of the second micromechanical arms. The vertical micro spring structure includes an upper portion connected to the metal connection structure and a lower portion connected to a top end of the second micromechanical arm. The upper portion and the lower portion are connected at a center of the vertical micro spring structure and form a first corner facing horizontally. The MEMS actuator further includes a horizontal micro spring structure disposed between one of the first micromechanical arms and one of the second micromechanical arms adjacent to the first micromechanical arm. The horizontal micro spring structure further includes a first portion connected to a sidewall of the first micromechanical arm, and a second portion connected to a sidewall of the second micromechanical arm. The first portion and the second portion are connected at a center of the horizontal micro spring structure and form a second corner facing vertically.

In accordance with some aspects of the disclosure, a method for fabricating a MEMS actuator is provided. In one example, a method includes providing a base structure including a top wafer, a bottom wafer bonded to the top wafer, and a sacrificial portion. The method further includes forming a trench in the top wafer and a first protrusion and a second protrusion spaced from each other in the trench, forming multiple first micromechanical arms and multiple second micromechanical arms. The first micromechanical arms and the second micromechanical arms are interposed, each one of the first and second micromechanical arms extends downwardly from a top end to a bottom end, and one of the second micromechanical arms is disposed between the first and second protrusions. The method further includes forming a first spacer, a second spacer, and an opening between the first and second spacers. The first spacer and the second spacer are respectively disposed on and in contact with top surfaces of the first and second protrusions, and the opening is located on and vertically aligned with the second micromechanical arm between the first and second protrusions. The method further includes forming a vertical bilayer composite structure in the opening and disposed on the top end of the second micromechanical arm between the first and second protrusions. The vertical bilayer composite structure includes an oxide layer and a metal layer horizontally bonded to and stacked with the oxide layer. The method further includes forming a metal connection structure. The metal connection structure is connected to the top end of each first micromechanical arm, and the vertical bilayer composite structure interconnects the metal connection structure and the top end of the second micromechanical arm between the first and second protrusions. The method further includes removing the sacrificial portion of the base structure, the first and second spacers, and the first and second protrusions to form a cavity in the base structure, and vertical bilayer composite structure is disposed in the cavity. The method further includes performing an annealing process to transform the vertical bilayer composite structure into a vertical micro spring structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electromechanical system (MEMS) actuator, comprising:
    a first micromechanical arm array comprising a plurality of first micromechanical arms spaced from each other in a first horizontal direction and extending in a second horizontal direction;
    a second micromechanical arm array comprising a plurality of second micromechanical arms spaced from each other in the first horizontal direction and extending in the second horizontal direction, wherein the first micromechanical arm array and the second micromechanical arm array are interposed in the first horizontal direction;
    a metal connection structure extending in the first horizontal direction, wherein the metal connection structure is connected to a top end of each first micromechanical arm; and
    a vertical micro spring structure disposed between the metal connection structure and one of the plurality of the second micromechanical arms, wherein the vertical micro spring structure comprises:
        an upper portion connected to the metal connection structure; and
        a lower portion connected to a top end of said one of the second micromechanical arms,
        wherein the upper portion and the lower portion are connected at a center of the vertical micro spring structure and form a first corner facing horizontally.

2. The MEMS actuator of claim 1, wherein each one of the first micromechanical arms and the second micromechanical arms further comprises a major body and a cover layer disposed on and surrounding the major body, the major body is composed of polysilicon, and the cover layer is composed of thermal oxide.

3. The MEMS actuator of claim 1, wherein the vertical micro spring structure further comprises a first layer and a second layer bonded to and staked with each other in the first horizontal direction.

4. The MEMS actuator of claim 3, wherein the first layer is composed of an expansive material having a first coefficient of thermal expansion (CTE), the second layer is composed of a compressive material having a second coefficient of thermal expansion (CTE), and the first CTE is at least 10 times higher than the second CTE.

5. The MEMS actuator of claim 4, wherein the first CTE is from 10 to 50 ppm/° C., and the second CTE is from 0.1 to 1.0 ppm/° C.

6. The MEMS actuator of claim 3, wherein the first layer is a metal layer composed of AlCu alloy.

7. The MEMS actuator of claim 3, wherein the second layer is an oxide layer composed of thermal silicon dioxide.

8. The MEMS actuator of claim 1, wherein the first corner has an angle ($\alpha$) of 15 degrees to 170 degrees.

9. The MEMS actuator of claim 1, wherein the upper portion forms a first angle ($\theta$) with the metal connection structure, the lower portion also forms a second angle ($\theta$) with the top end of the second micromechanical arm, and the first and second angles ($\theta$) are at least 15 degrees.

10. The MEMS actuator of claim 1, wherein the vertical micro spring structure has a critical dimension in the first horizontal direction of at least 1 µm.

11. The MEMS actuator of claim 1, wherein the vertical micro spring structure has a vertical dimension of at least 1.6 µm.

12. A MEMS actuator, comprising:
    a first micromechanical arm array comprising a plurality of first micromechanical arms spaced from each other in a first horizontal direction and extending in a second horizontal direction;
    a second micromechanical arm array comprising a plurality of second micromechanical arms spaced from each other in the first horizontal direction and extending in the second horizontal direction, wherein the first micromechanical arm array and the second micromechanical arm array are interposed in the first horizontal direction;
    a metal connection structure extending in the first horizontal direction, wherein the metal connection structure is connected to a top end of each first micromechanical arm;
    a vertical micro spring structure disposed between the metal connection structure and at least one of the plurality of the second micromechanical arms, wherein the vertical micro spring structure comprises:
        an upper portion connected to the metal connection structure; and
        a lower portion connected to a top end of said one of the second micromechanical arms,
        wherein the upper portion and the lower portion are connected at a center of the vertical micro spring structure and form a first corner facing horizontally; and
    a horizontal micro spring structure disposed between one of the first micromechanical arms and one of the second micromechanical arms adjacent to one of the first micromechanical arms, wherein the horizontal micro spring structure further comprises:
        a first portion connected to a sidewall of said one of the first micromechanical arms; and
        a second portion connected to a sidewall of said one of the second micromechanical arms;
        wherein the first portion and the second portion are connected at a center of the horizontal micro spring structure and form a second corner facing vertically.

13. The MEMS actuator of claim 12, wherein,
    the vertical micro spring structure further comprises a first layer and a second layer bonded to and staked with each other vertically; and
    the horizontal micro spring structure further comprises a third layer and a fourth layer bonded to and staked with each other vertically.

14. The MEMS actuator of claim 13, wherein the first layer and the third layer are composed of an expansive material having a first CTE, the second layer and the fourth layer is composed of a compressive material having a second CTE, and the first CTE is at least 10 times higher than the second CTE.

15. The MEMS actuator of claim 13, wherein the first layer and the third layer are a metal layer composed of AlCu alloy.

16. The MEMS actuator of claim 13, wherein the second layer and the fourth layer are an oxide layer composed of thermal silicon dioxide.

17. The MEMS actuator of claim 12, wherein the upper portion of the vertical micro spring structure forms a first angle (θ) with the metal connection structure, the lower portion of the vertical micro spring structure also forms a second angle (θ) with the top end of said one of the second micromechanical arms, the first portion of the horizontal micro spring structure forms a third angle (θ) with said one of the first micromechanical arms, the second portion of the horizontal micro spring structure forms a fourth angle (θ) with said one of the second micromechanical arms, and the first, second, third, and fourth angles (θ) are at least 15 degrees.

18. A method for fabricating a MEMS actuator, the method comprising:
 providing a base structure comprising a top wafer, a bottom wafer bonded to the top wafer, and a sacrificial portion;
 forming a trench in the top wafer and a first protrusion and a second protrusion spaced from each other in the trench;
 forming a plurality of first micromechanical arms and a plurality of second micromechanical arms, wherein the plurality of first micromechanical arms and the plurality of second micromechanical arms are interposed, each one of the first and second micromechanical arms extends downwardly from a top end to a bottom end, and one of the plurality of second micromechanical arms is disposed between the first and second protrusions;
 forming a first spacer, a second spacer, and an opening between the first and second spacers, wherein the first spacer and the second spacer are respectively disposed on and in contact with top surfaces of the first and second protrusions, and the opening is located on and vertically aligned with said one of the second micromechanical arms between the first and second protrusions;
 forming a vertical bilayer composite structure in the opening and disposed on the top end of the second micromechanical arm between the first and second protrusions, wherein the vertical bilayer composite structure comprises an oxide layer and a metal layer horizontally bonded to and stacked with the oxide layer;
 forming a metal connection structure, wherein the metal connection structure is connected to the top end of each first micromechanical arm, and the vertical bilayer composite structure interconnects the metal connection structure and the top end of said one of the second micromechanical arms between the first and second protrusions;
 removing the sacrificial portion of the base structure, the first and second spacers, and the first and second protrusions to form a cavity in the base structure, wherein the vertical bilayer composite structure is disposed in the cavity; and
 performing an annealing process to transform the vertical bilayer composite structure into a vertical micro spring structure.

19. The method of claim 18, further comprising:
 forming a passivation layer on the metal connection structure.

20. The method of claim 18, wherein the metal layer is composed of AlCu.

* * * * *